(12) United States Patent
Wang et al.

(10) Patent No.: US 12,242,686 B2
(45) Date of Patent: Mar. 4, 2025

(54) TOUCH STRUCTURE AND MANUFACTURING METHOD THEREOF, DISPLAY PANEL, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yu Wang, Beijing (CN); Guoyi Cui, Beijing (CN); Tao Gao, Beijing (CN); Zeliang Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/548,339

(22) PCT Filed: Jul. 27, 2022

(86) PCT No.: PCT/CN2022/108197
§ 371 (c)(1),
(2) Date: Aug. 30, 2023

(87) PCT Pub. No.: WO2023/016257
PCT Pub. Date: Feb. 16, 2023

(65) Prior Publication Data
US 2024/0134475 A1   Apr. 25, 2024
US 2024/0231523 A9   Jul. 11, 2024

(30) Foreign Application Priority Data

Aug. 13, 2021 (CN) .......... 202110929096.X

(51) Int. Cl.
G06F 3/041   (2006.01)
G06F 3/044   (2006.01)
(Continued)

(52) U.S. Cl.
CPC .......... *G06F 3/0412* (2013.01); *G06F 3/0445* (2019.05); *G06F 3/0446* (2019.05);
(Continued)

(58) Field of Classification Search
CPC .............. G06F 2203/04102; G06F 2203/0411; G06F 2203/04107; G06F 3/04164; G06F 3/0416;
(Continued)

(56) References Cited

U.S. PATENT DOCUMENTS 6,091,196 A       7/2000  Codama
2015/0124182 A1*  5/2015  Chen ................ G06F 3/041
                                                    174/268

(Continued)

FOREIGN PATENT DOCUMENTS

CN       104465695 A       3/2015

OTHER PUBLICATIONS

PCT International Search Report and Written Opinion (w/ English translation) for corresponding PCT Application No. PCT/CN2022/108197, mailed Oct. 11, 2022, 16 pages.
(Continued)

*Primary Examiner* — Dong Hui Liang
(74) *Attorney, Agent, or Firm* — Dority & Manning, P.A.

(57) ABSTRACT

A touch structure includes at least one touch functional layer group and at least one protective pad layer. The at least one touch functional layer group includes an organic layer and a conductive layer that are sequentially stacked. The at least one protective pad layer is arranged in one-to-one correspondence with the at least one touch functional layer group.

(Continued)

A protective pad layer is located between a conductive layer and an organic layer of a corresponding touch functional layer group. An orthographic projection of the protective pad layer on the organic layer at least partially overlaps with an orthographic projection of the conductive layer on the organic layer.

15 Claims, 20 Drawing Sheets

(51) Int. Cl.
  *H10K 59/12* (2023.01)
  *H10K 59/40* (2023.01)
(52) U.S. Cl.
  CPC ......... *H10K 59/1201* (2023.02); *H10K 59/40* (2023.02); *G06F 2203/04107* (2013.01)
(58) Field of Classification Search
  CPC ...... G06F 3/044; G06F 3/04184; G06F 3/047; G06F 3/04166; G06F 1/163
  See application file for complete search history.

(56) References Cited

U.S. PATENT DOCUMENTS

| | | |
|---|---|---|
| 2015/0185887 A1 | 7/2015 | Park et al. |
| 2016/0085326 A1* | 3/2016 | Wu ........................ H05K 3/246 156/60 |
| 2016/0172386 A1 | 6/2016 | Sun et al. |
| 2017/0010741 A1* | 1/2017 | Chang ................... G06F 3/0446 |
| 2017/0115818 A1* | 4/2017 | Cai ....................... G06F 3/0412 |
| 2017/0344162 A1* | 11/2017 | Lee ....................... G06F 3/0443 |
| 2018/0097199 A1 | 4/2018 | Jo et al. |
| 2018/0358413 A1* | 12/2018 | Lee ..................... G06F 3/04164 |
| 2020/0201481 A1* | 6/2020 | Lee ....................... G06F 3/0446 |
| 2020/0350512 A1 | 11/2020 | Guo et al. |

OTHER PUBLICATIONS

Extended European Search Report for corresponding EP Application No. 22855240.2, dated Jul. 25, 2024, 9 pages.

* cited by examiner

TOUCH STRUCTURE AND MANUFACTURING METHOD THEREOF, DISPLAY PANEL, AND DISPLAY DEVICE

CROSS-REFERENCE TO RELATED APPLICATIONS

This application is a national phase entry under 35 USC 371 of International Patent Application No. PCT/CN2022/108197, filed on Jul. 27, 2022, which claims priority to Chinese Patent Application No. 202110929096.X, filed on Aug. 13, 2021, which are incorporated herein by reference in their entirety.

TECHNICAL FIELD

The present disclosure relates to the field of display technologies, and in particular, to a touch structure, a manufacturing method of a touch structure, a display panel and a display device.

BACKGROUND

With the development of the display technology field, the organic light-emitting diode (OLED) display panel has gradually become one of the mainstream products in the field.

At present, for the OLED display panel with a large-sized touch display, people pay more attention to the touch performance and bending performance of the touch display.

SUMMARY

In an aspect, a touch structure is provided. The touch structure includes at least one touch functional layer group and at least one protective pad layer. The at least one touch functional layer group includes an organic layer and a conductive layer that are sequentially stacked. The at least one protective pad layer is arranged in one-to-one correspondence with the at least one touch functional layer group. A protective pad layer is located between a conductive layer and an organic layer of a corresponding touch functional layer group. An orthographic projection of the protective pad layer on the organic layer at least partially overlaps with an orthographic projection of the conductive layer on the organic layer.

In some embodiments, the at least one touch functional layer group includes a first touch functional layer group and a second touch functional layer group. The first touch functional layer group includes a first organic layer and a first conductive layer that are sequentially stacked. The second touch functional layer group is disposed on a side of the first conductive layer away from the first organic layer, and the second touch functional layer group includes a second organic layer and a second conductive layer that are sequentially stacked.

The at least one protective pad layer is arranged corresponding to the first conductive layer and/or the second conductive layer, and an orthographic projection of the protective pad layer on the first organic layer at least partially overlaps an orthographic projection of a corresponding conductive layer on the first organic layer.

In some embodiments, the orthographic projection of the protective pad layer on the first organic layer approximately coincides with the orthographic projection of the corresponding conductive layer on the first organic layer; or the orthographic projection of the protective pad layer on the first organic layer is a closed shape, and the orthographic projection of the corresponding conductive layer on the first organic layer is located within a boundary of the closed shape.

In some embodiments, the touch structure has a touch region and a bonding region located on a side of the touch region. The orthographic projection of the protective pad layer on the first organic layer and the bonding region are staggered.

In some embodiments, the at least one protective pad layer includes a first protective pad layer and/or a second protective pad layer. The first protective pad layer is arranged corresponding to the first conductive layer, and is located between the first conductive layer and the first organic layer. The second protective pad layer is arranged corresponding to the second conductive layer, and is located between the second conductive layer and the second organic layer.

In some embodiments, a thickness of a conductive layer in the first conductive layer and the second conductive layer that is arranged corresponding to the protective pad layer is greater than or equal to 0.3 μm.

In some embodiments, one of the first conductive layer and the second conductive layer is arranged corresponding to the protective pad layer, and the thickness of the conductive layer that is arranged corresponding to the protective pad layer is greater than a thickness of another of the first conductive layer and the second conductive layer.

In some embodiments, a thickness of one of the first conductive layer and the second conductive layer that is arranged corresponding to no protective pad layer is less than 0.3 μm.

In some embodiments, the touch structure has a touch region, and the touch structure includes a plurality of touch units disposed in the touch region. The plurality of touch units includes a plurality of first touch units and a plurality of second touch units. Each first touch unit extends along a first direction, and the plurality of first touch units are arranged side by side along a second direction, the second direction and the first direction intersecting. Each second touch unit extends along the second direction, and the plurality of second touch units are arranged side by side along the first direction.

The first touch unit includes a plurality of first touch electrodes and a plurality of first connection portions, and two adjacent first touch electrodes are electrically connected to each other through a first connection portion. The second touch unit includes a plurality of second touch electrodes and a plurality of second connection portions, and two adjacent second touch electrodes are electrically connected to each other through a second connection portion. The plurality of first touch electrodes, the plurality of second touch electrodes and the plurality of first connection portions are arranged in one of the first conductive layer and the second conductive layer, and the plurality of second connection portions are arranged in another of the first conductive layer and the second conductive layer.

Or, the plurality of first touch electrodes, the plurality of second touch electrodes and the plurality of second connection portions are arranged in the one of the first conductive layer and the second conductive layer, and the plurality of first connection portions are arranged in the another of the first conductive layer and the second conductive layer.

In some embodiments, the plurality of first touch electrodes, the plurality of second touch electrodes and the plurality of first connection portions are arranged in the same conductive layer, and a conductive layer where the plurality of second connection portions are located is arranged corresponding to the protective pad layer.

Or, the plurality of first touch electrodes, the plurality of second touch electrodes and the plurality of second connection portions are arranged in the same conductive layer, and a conductive layer where the plurality of first connection portions are located is arranged corresponding to the protective pad layer.

In some embodiments, the touch structure further includes a plurality of auxiliary electrodes. The plurality of first touch electrodes and the plurality of second touch electrodes are arranged in one of the first conductive layer and the second conductive layer, and the plurality of auxiliary electrodes are arranged in another of the first conductive layer and the second conductive layer. An orthographic projection of each auxiliary electrode on the first organic layer at least partially overlaps an orthographic projection of a first touch electrode or a second touch electrode on the first organic layer; the auxiliary electrode is electrically connected to the first touch electrode or the second touch electrode through via holes in the second organic layer.

In some embodiments, a surface of the protective pad layer close to a corresponding conductive layer has a plurality of depressions, and a surface of the corresponding conductive layer away from the protective pad layer has a plurality of depressions.

In some embodiments, a material of the protective pad layer includes an inorganic material.

In some embodiments, a thickness of the protective pad layer is less than a thickness of the organic layer of the corresponding touch functional layer group.

In another aspect, a display panel is provided. The display panel includes a display substrate and the touch structure as described in any one of the above embodiments. The touch structure is disposed on a light-exit side of the display substrate.

In some embodiments, the display substrate includes an encapsulation layer, and the touch structure is directly disposed on the encapsulation layer.

In yet another aspect, a display device is provided. The display device includes the display panel as described in any one of the above embodiments.

In yet another aspect, a manufacturing method of a touch structure is provided. The touch structure includes at least one touch functional layer group, and each touch functional layer group includes an organic layer and a conductive layer that are sequentially stacked. The manufacturing method includes: sequentially forming the organic layer and the conductive layer.

Before forming the conductive layer, the manufacturing method further includes forming a protective pad layer on the organic layer, an orthographic projection of the protective pad layer on the organic layer at least partially overlapping with an orthographic projection of the conductive layer on the organic layer.

In some embodiments, the at least one touch functional layer group includes a first touch functional layer group and a second touch functional layer group, the first touch functional layer group includes a first organic layer and a first conductive layer that are sequentially stacked, and the second touch functional layer group includes a second organic layer and a second conductive layer that are sequentially stacked. The manufacturing method includes: sequentially forming the first organic layer, the first conductive layer, the second organic layer, and the second conductive layer.

Before forming the first conductive layer, the manufacturing method further includes forming a first protective pad layer on the first organic layer, an orthographic projection of the first protective pad layer on the first organic layer at least partially overlapping with an orthographic projection of the first conductive layer on the first organic layer.

And/or, before forming the second conductive layer, the manufacturing method further includes forming a second protective pad layer on a side of the second organic layer away from the first organic layer, an orthographic projection of the second protective pad layer on the first organic layer at least partially overlapping with an orthographic projection of the second conductive layer on the first organic layer.

In some embodiments, forming the first protective pad layer on the first organic layer includes:
  forming a first protective film on the first organic layer;
  forming the first conductive layer on a side of the first protective film away from the first organic layer; and
  patterning the first protective film by using the first conductive layer as a mask, so as to obtain the first protective pad layer.

Or, the touch structure has a touch region and a bonding region located on a side of the touch region, and forming the first protective pad layer on the first organic layer includes:
  forming the first protective film on the first organic layer; and
  removing a portion of the first protective film located in the bonding region, so as to obtain the first protective pad layer.

In some embodiments, forming the second protective pad layer on the side of the second organic layer away from the first organic layer includes:
  forming a second protective film on the side of the second organic layer away from the first organic layer;
  forming the second conductive layer on a side of the second protective film away from the first organic layer; and
  patterning the second protective film by using the second conductive layer as a mask, so as to obtain the second protective pad layer.

Or, the touch structure has a touch region and a bonding region located on a side of the touch region, and forming the second protective pad layer on the side of the second organic layer away from the first organic layer includes:
  forming the second protective film on the side of the second organic layer away from the first organic layer; and
  removing a portion of the second protective film located in the bonding region, so as to obtain the second protective pad layer.

BRIEF DESCRIPTION OF THE DRAWINGS

In order to describe technical solutions in the present disclosure more clearly, the accompanying drawings to be used in some embodiments of the present disclosure will be introduced briefly. However, the accompanying drawings to be described below are merely some embodiments of the present disclosure, and a person of ordinary skill in the art can obtain other drawings according to those drawings. In addition, accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
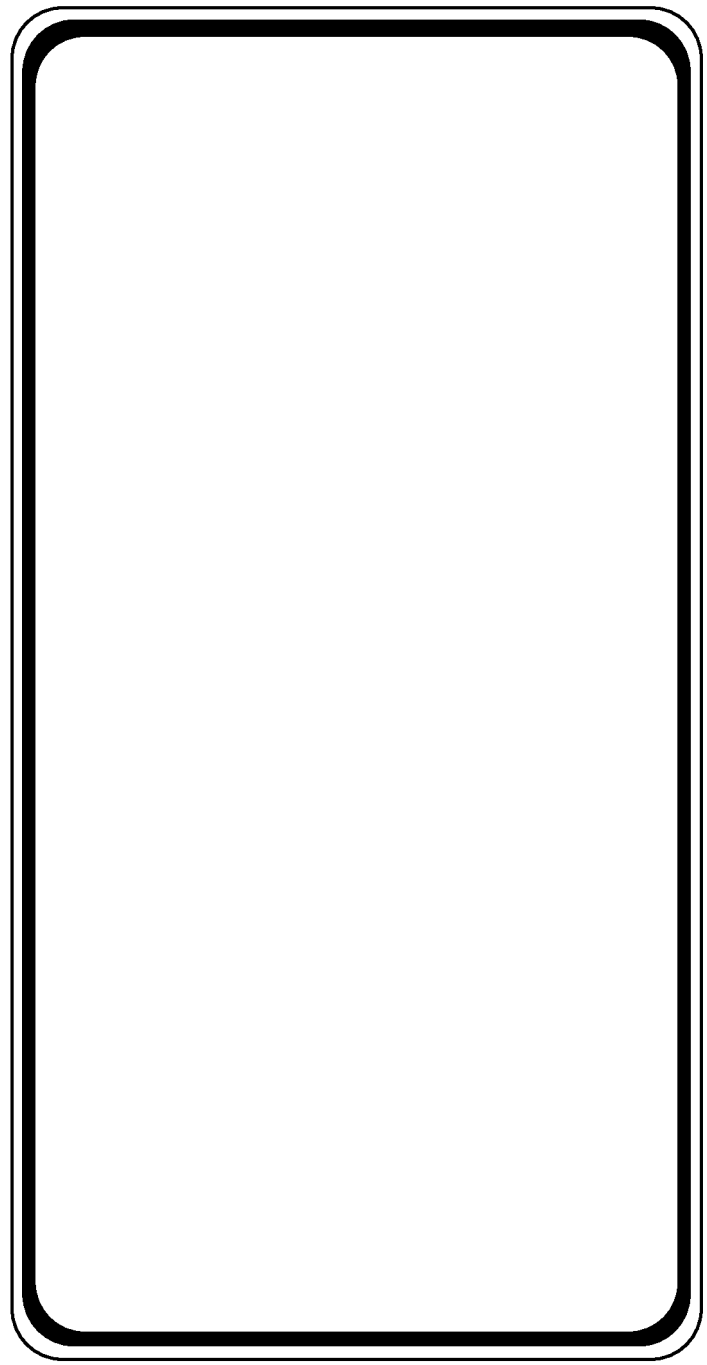
FIG. 1 is a structural diagram of a display device, in accordance with some embodiments.

The technical solutions in some embodiments of the present disclosure will be described clearly and completely with reference to the accompanying drawings. However, the described embodiments are merely some but not all of embodiments of the present disclosure. All other embodiments obtained on the basis of the embodiments of the present disclosure by a person of ordinary skill in the art shall be included in the protection scope of the present disclosure.

Unless the context requires otherwise, throughout the description and claims, the term "comprise" and other forms thereof such as the third-person singular form "comprises" and the present participle form "comprising" are construed as an open and inclusive meaning, i.e., "included, but not limited to". In the description of the specification, the term such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above term do not necessarily refer to the same embodiment(s) or example(s). In addition, specific features, structures, materials or characteristics may be included in any one or more embodiments or examples in any suitable manner.

Hereinafter, the terms "first" and "second" are only used for descriptive purposes, and are not to be construed as indicating or implying relative importance or implicitly indicating the number of indicated technical features. Thus, a feature defined with the term such as "first" or "second" may explicitly or implicitly include one or more of the features. In the description of the embodiments of the present disclosure, the terms "a plurality of", "the plurality of" and "multiple" each mean two or more unless otherwise specified.

In the description of some embodiments, the terms such as "electrically connected" and derivatives thereof may be used. For example, the term "electrically connected" may be used in the description of some embodiments to indicate that two or more components are in direct physical contact or electrical contact with each other.

The phrase "A and/or B" includes the following three combinations: only A, only B, and a combination of A and B.

In addition, the use of the phrase "based on" is meant to be open and inclusive, since a process, step, calculation or other action that is "based on" one or more of the stated conditions or values may, in practice, be based on additional conditions or values exceeding those stated.

The term such as "substantially" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

Exemplary embodiments are described herein with reference to segmental views and/or plan views as idealized exemplary drawings. In the accompanying drawings, thicknesses of layers and sizes of regions are enlarged for clarity. Variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region that is shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Some embodiments of the present disclosure provide a display device. As shown in FIG. 1, the display device 1 may be an electroluminescent display device. The electroluminescent display device may be an OLED display device, e.g., an active matrix OLED (AMOLED) display device.

The display device 1 may be any device that may display images whether in motion (e.g., videos) or stationary (e.g., static images), and whether textual or graphical. More specifically, it is expected that the embodiments may be implemented in or associated with a plurality of electronic devices. The plurality of electronic devices may include (but is not limit to), for example, mobile telephones, wireless devices, personal data assistants (PADs), hand-held or portable computers, GPS receivers/navigators, cameras, MP4 video players, video cameras, game consoles, watches, clocks, calculators, TV monitors, flat panel displays, computer monitors, car displays (such as odometer displays), navigators, cockpit controllers and/or displays, camera view displays (such as rear view camera displays in vehicles), electronic photos, electronic billboards or indicators, projectors, building structures, packagings and aesthetic structures (such as a display for an image of a piece of jewelry).

Figure 2:
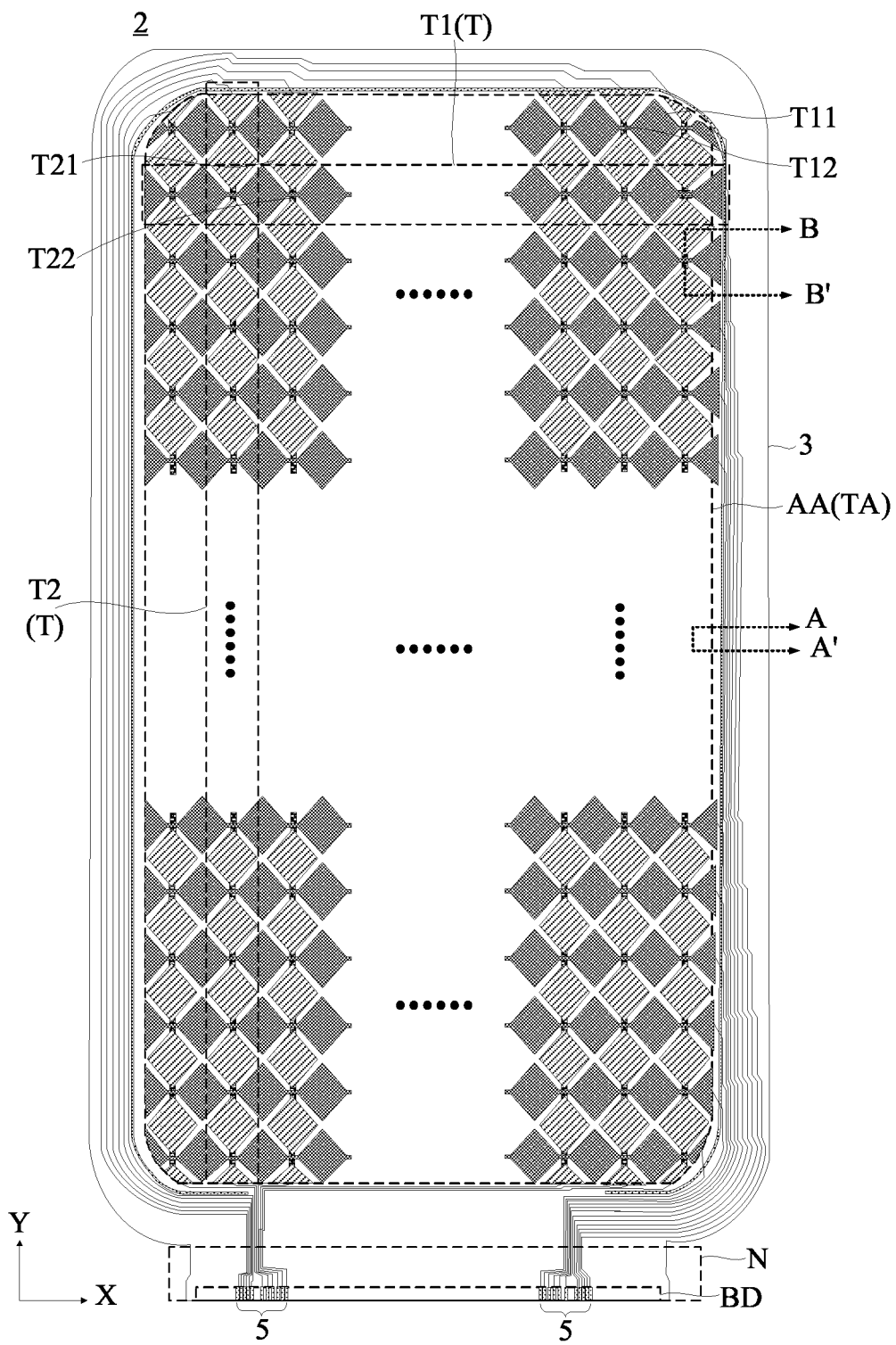
FIG. 2 is a structural diagram of a display panel, in accordance with some embodiments.
Figure 3:
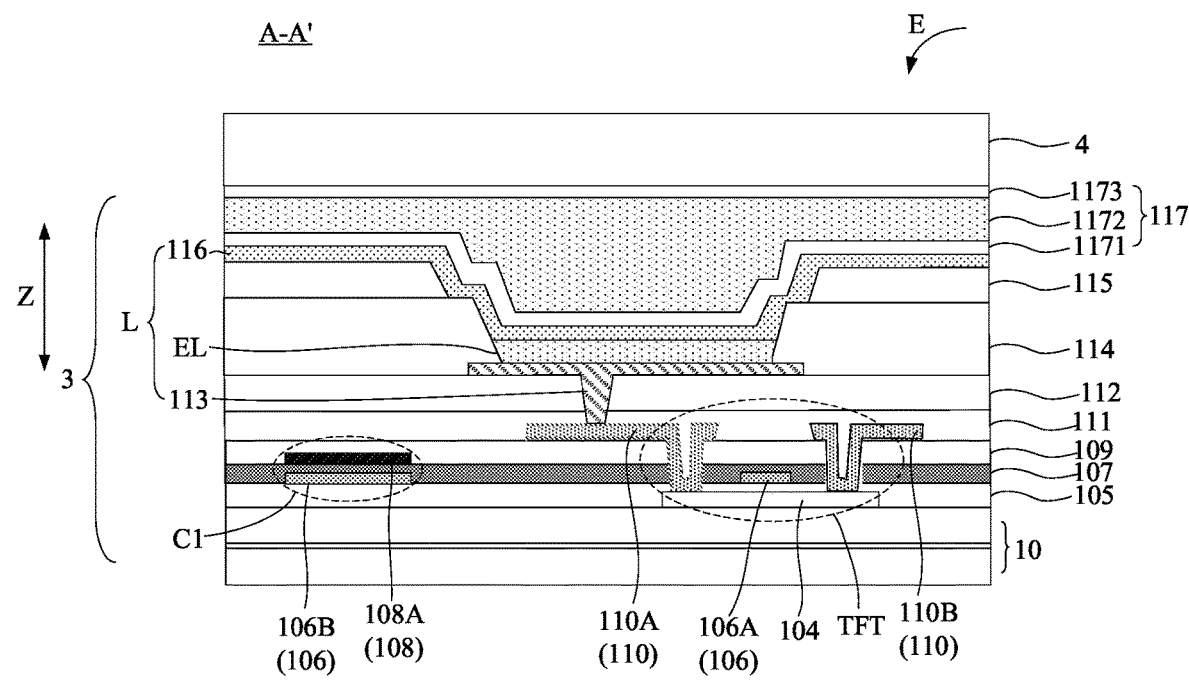
FIG. 3 is a sectional view of the display panel in FIG. 2 taken along the line A-A'.

As shown in FIGS. 2 and 3, the display device 1 includes a display panel 2, and the display panel 2 has a display region (active area, AA for short) AA for displaying images. The display panel 2 includes a display substrate 3 and a touch structure 4, and the touch structure 4 is disposed on a light-exit side E of the display substrate 3.

As shown in FIG. 3, the display substrate 3 includes a substrate 10, and a plurality of driving circuits and a plurality of light-emitting devices L that are disposed on the substrate 10. Based on this, the display substrate 3 includes a plurality of sub-pixels, each sub-pixel includes a pixel driving circuit and a light-emitting device L, and the pixel driving circuit is electrically connected to the light-emitting device L.

For example, the substrate 10 may be of a multi-layer structure. For example, as shown in FIG. 3, the substrate 10 may include a first polyimide layer, a buffer layer, and a second polyimide layer that are sequentially stacked. As another example, the substrate 10 may include a first polyimide layer, a first buffer layer, a second polyimide layer, and a second buffer layer that are sequentially stacked.

As shown in FIG. 3, the display substrate 3 further includes an active layer 104, a first gate insulating layer 105, a first gate conductive layer 106, a second gate insulating layer 107, a second gate conductive layer 108, an interlayer dielectric layer 109, and a source-drain conductive layer 110 that are sequentially stacked on the substrate 10.

The first gate insulating layer 105 insulates the active layer 104 from the first gate conductive layer 106, the second gate insulating layer 107 insulates the first gate conductive layer 106 from the second gate conductive layer 108, and the interlayer dielectric layer 109 insulates the second gate conductive layer 108 from the source-drain conductive layer 110.

As shown in FIG. 3, each pixel driving circuit includes a plurality of thin film transistors TFT and at least one capacitor C1, and FIG. 3 shows one of the thin film transistors TFT and one capacitor C1.

The thin film transistor TFT includes a portion of the active layer 104, a portion of the first gate insulating layer 105, a gate 106A arranged in the first gate conductive layer 106, a portion of the second gate insulating layer 107, a portion of the interlayer dielectric layer 109, and a source 110A and a drain 110B that both arranged in the source-drain conductive layer 110.

For example, the active layer 104 may be disposed on the substrate 10, the first gate insulating layer 105 covers the substrate 10 and the active layer 104, the gate 106A is disposed on a side of the first gate insulating layer 105 away from the substrate 10, the second gate insulating layer 107 covers the gate 106A and the first gate insulating layer 105, the interlayer dielectric layer 109 covers the second gate insulating layer 107, the source 110A and the drain 110B are disposed on a side of the interlayer dielectric layer 109 away from the substrate 10, and the source 110A and the drain 110B may be electrically connected to the active layer 104 through via holes penetrating through the interlayer dielectric layer 109, the second gate insulating layer 107 and the first gate insulating layer 105.

It can be understood that, the gate 106A is disposed on a side of the active layer 104 away from the substrate 10. That is, the gate 106A is located above the active layer 104. The thin film transistor TFT is a top-gate thin film transistor. In some other embodiments, the gate 106A may be disposed on a side of the active layer 104 proximate to the substrate 10. That is, the gate 106A is located under the active layer 104. The thin film transistor TFT is a bottom-gate thin film transistor.

The capacitor C1 may include a first plate 106B disposed in the first gate conductive layer 106 and a second plate 108A disposed in the second gate conductive layer 108. The first plate 106B is arranged in the same layer as the gate 106A. The second plate 108A is disposed between the second gate insulating layer 107 and the interlayer dielectric layer 109, and is opposite to the first plate 106B.

As shown in FIG. 3, the display substrate 3 further includes a passivation layer 111 and a planarization layer 112 that are sequentially stacked on a side of source-drain conductive layer 110 away from the substrate 10. The passivation layer 111 and the planarization layer 112 cover the source 110A and the drain 110B, so as to protect the source 110A and the drain 110B.

In addition, the above-mentioned film layers where the pixel driving circuit is located further include gate lines, data lines, voltage drain drain (VDD) lines, and a voltage source source (VSS) line. Each pixel driving circuit is electrically connected to a gate line, a data line, and a VDD line, and is used to output a driving signal to a light-emitting device L. The VDD lines may be a plurality of lines extending in a second direction Y in the display region AA. The VSS line may be disposed in a peripheral region and surrounds the display region AA.

For example, the second direction Y is consistent with a column direction of the plurality of sub-pixels arranged in an array in the display substrate 3.

The above-mentioned layers where the driving circuits are located further include a gate driving circuit, and clock signal lines, start vertical (STV) lines, high gate voltage (VGH) lines, and low gate voltage (VGL) lines that are electrically connected to the gate driving circuit.

As shown in FIG. 3, the display substrate 3 further includes a first electrode 113 disposed on a side of the planarization layer 112 away from the substrate 10, and the first electrode 113 is electrically connected to the source 110A through a via hole penetrating through the planarization layer 112 and the passivation layer 111.

As shown in FIG. 3, the display substrate 3 further includes a pixel defining layer 114 disposed on a side of the planarization layer 112 away from the substrate 10. The pixel defining layer 114 has a plurality of openings, each opening exposes at least part of a first electrode 113, and each opening is located in a sub-pixel.

As shown in FIG. 3, the light-emitting device L includes the first electrode 113, a light-emitting functional layer EL and a second electrode 116.

The light-emitting functional layer EL is located in the opening of the pixel defining layer 114 and formed on the first electrode 113. The light-emitting functional layer EL may include a small molecular organic material or a polymer molecular organic material, which may be a fluorescent light-emitting material or a phosphorescent light-emitting material that being capable of emitting red light, green light, blue light, or white light. In addition, according to different actual needs, in different examples, the light-emitting functional layer EL may further includes one or more of an electron transport layer (ETL), an electron injection layer (EIL), a hole transport layer (HTL), and a hole injection layer (HIL).

The second electrode 116 covers the light-emitting functional layer EL. It will be noted that, second electrodes 116 of the light-emitting devices L in all sub-pixels are connected to one another to form a planar electrode as a whole layer to serve as a common electrode for all the light-emitting devices L.

For example, the first electrode 113 may be an anode, and the second electrode 116 may be a cathode.

The first electrode 113 of the light-emitting device L is electrically connected to the pixel driving circuit, so as to receive the driving signal from the pixel driving circuit. An edge of the second electrode 116 extends to the peripheral region, and is electrically connected to the VSS line to receive a VSS signal from the VSS line. Therefore, an electric field is created between the first electrode 113 and the second electrode 116, so as to excite the light-emitting functional layer EL to emit light.

As shown in FIG. 3, the display substrate 3 further includes a supporting portion 115 disposed on a side of the pixel defining layer 114 away from the substrate 10, and the support portion 115 may play a role of supporting and protecting layers located thereunder.

As shown in FIG. 3, the display substrate 3 further includes an encapsulation layer 117 disposed on a side of the second electrode 116 away from the substrate 10. The encapsulation layer 117 may include a first inorganic encapsulation sub-layer 1171, an organic encapsulation sub-layer 1172 and a second inorganic encapsulation sub-layer 1173 that are sequentially stacked. The encapsulation layer 117 is used for encapsulation of the display substrate 3, which prevents moisture and oxygen from entering and eroding the light-emitting devices L.

As shown in FIG. 3, techniques for directly arranging the touch structure 4 on the encapsulation layer 117 of the display substrate 3 include flexible single-layer on cell (FSLOC) technology and flexible multi-layer on cell (FMLOC) technology.

The FSLOC technology may be based on a working principle of self-capacitance (or voltage) detection, and generally provides a single layer of metal to form touch electrodes. When a finger touches the display device, the finger will carry away charges on the touch unit, and a touch integrated circuit (IC) recognizes a touch position of the finger by detecting change in a self-capacitance value (or a voltage value) of touch electrodes, so that the touch function of the display device is realized.

The FMLOC technology may be based on a working principle of a mutual capacitance detection, and the touch structure 4 generally adopts two layers of metal to form touch driving electrodes (TX) and touch sensing electrodes (RX). When the finger touches the display device, the finger will carry away charges on the touch driving electrode or the touch sensing electrode, and the touch IC recognizes the touch position of the finger by detecting change in a self-capacitance value of the touch driving electrode and the touch sensing electrode, so that the touch function of the display device is realized.

Figure 4A:
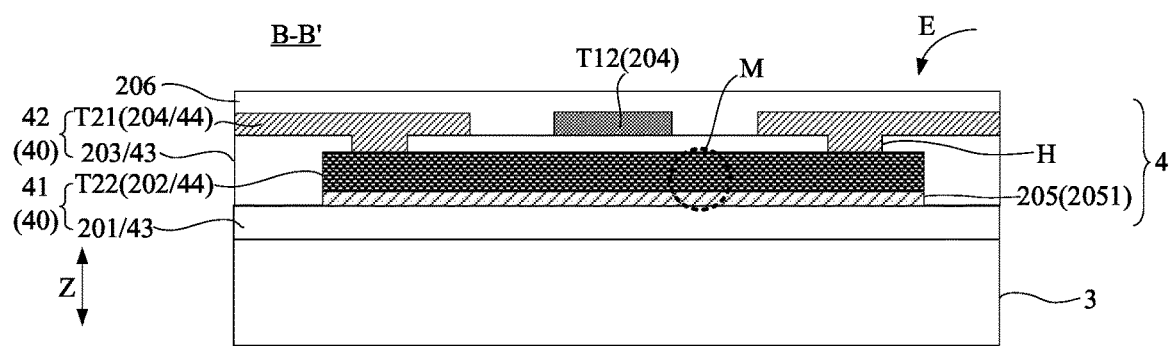
FIG. 4A is a sectional view of the display panel in FIG. 2 taken along the line B-B'.
Figure 4B:
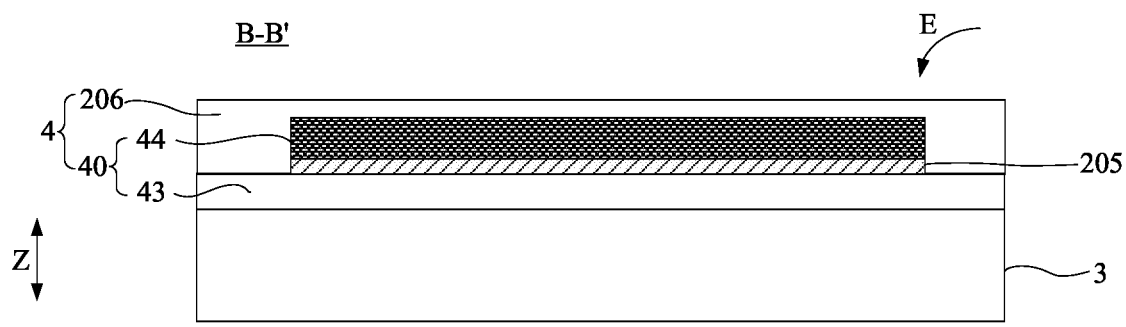
FIG. 4B is a sectional view of a display panel taken along the line B-B', in accordance with some other embodiments.

Some embodiments of the present disclosure provide a touch structure 4. As shown in FIGS. 4A and 4B, from the perspective of the film layers of the touch structure 4, the touch structure 4 includes at least one touch functional layer group 40, and the at least one touch functional layer group 40 includes an organic layer 43 and a conductive layer 44 that are sequentially stacked.

For example, as shown in FIG. 4A, the touch structure 4 includes two touch functional layer groups 40, and each touch functional layer group 40 includes an organic layer 43 and a conductive layer 44 that are sequentially stacked. That is, the touch structure 4 includes two conductive layers 44. In this case, the display panel 2 with the touch structure 4 adopts the FMLOC technology.

For example, as shown in FIG. 4B, the touch structure 4 includes one touch functional layer group 40, the touch functional layer group 40 includes an organic layer 43 and a conductive layer 44 that are sequentially stacked. That is, the touch structure 4 includes one conductive layer 44. In this case, the display panel 2 with the touch structure 4 adopts the FSLOC technology.

As shown in FIGS. 4A and 4B, the touch structure 4 further includes at least one protective pad layer 205, the at least one protective pad layer 205 is arranged in one-to-one correspondence with the at least one touch functional layer group 40, and a protective pad layer 205 is located between a conductive layer 44 and an organic layer 43 of a corresponding touch functional layer group 40. An orthographic projection of the protective pad layer 205 on the organic layer 43 at least partially overlaps with an orthographic projection of the conductive layer 44 on the organic layer 43.

In the related art, a touch functional layer group of a touch structure mainly adopts an inorganic layer and a conductive layer that are sequentially stacked. The inventors of the present disclosure have found through research that, for some display panels with large-sized display screens, voltage signals transmitted by electrodes in the display substrates close to the touch structures (for example, the second electrodes 116 shown in FIG. 3) may interfere with the voltage signals transmitted by the conductive layers in the touch structures, thereby affecting the touch performance of the touch structures. In addition, the inorganic layer is an inorganic material layer, which has a poor bending performance, so that the display panel composed of the display substrate and the touch structure has a poor bending performance, which is not conducive to the preparation of the display panel with a curved screen.

Compared with the related art, in the above-mentioned embodiments of the present disclosure, the touch structure 4 includes the at least one touch functional layer group 40, and each touch functional layer group 40 includes the organic layer 43 and the conductive layer 44 that are sequentially stacked. Since the resistivity of the organic material is greater than the resistivity of the inorganic material, by replacing the inorganic layer with the organic layer 43, it may be possible to reduce the interference of the voltage signals transmitted by the electrodes close to the touch structure 4 in the display substrate 3 to the voltage signal transmitted by the conductive layer 44 in the touch functional layer group 40 of the touch structure 4, and in turn improve the touch performance of the touch structure 4.

In addition, the organic layer 43 is an organic material layer, and the bending performance of the organic material layer is better than the bending performance of the inorganic material layer, so that it may be possible to improve the bending performance of the display panel 2 composed of the display substrate 3 and the touch structure 4, and in turn facilitate the preparation of the display panel 2 with the curved screen.

Figure 26:
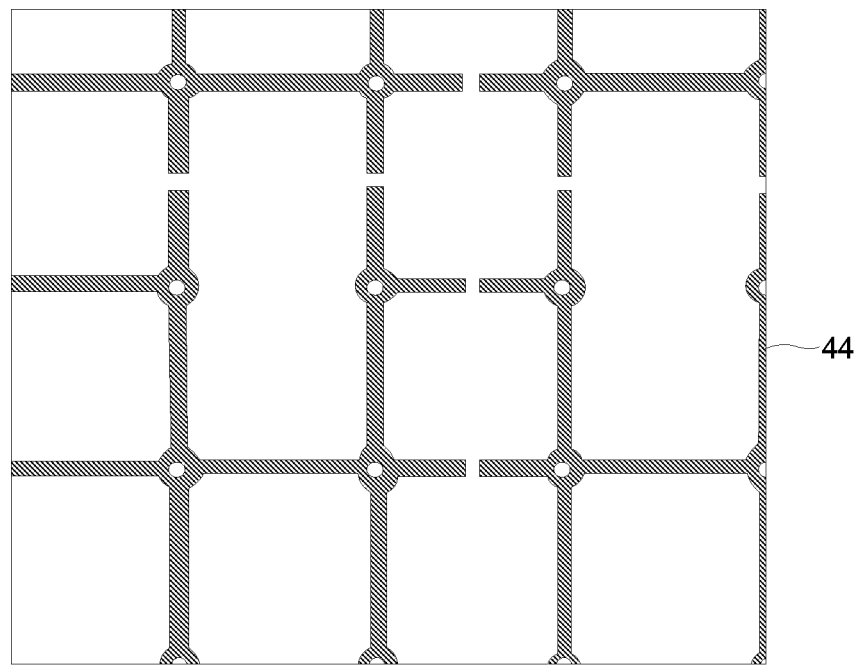
FIG. 26 is a structural diagram of a conductive layer in a touch structure of a display panel, in accordance with some embodiments.
Figure 28:
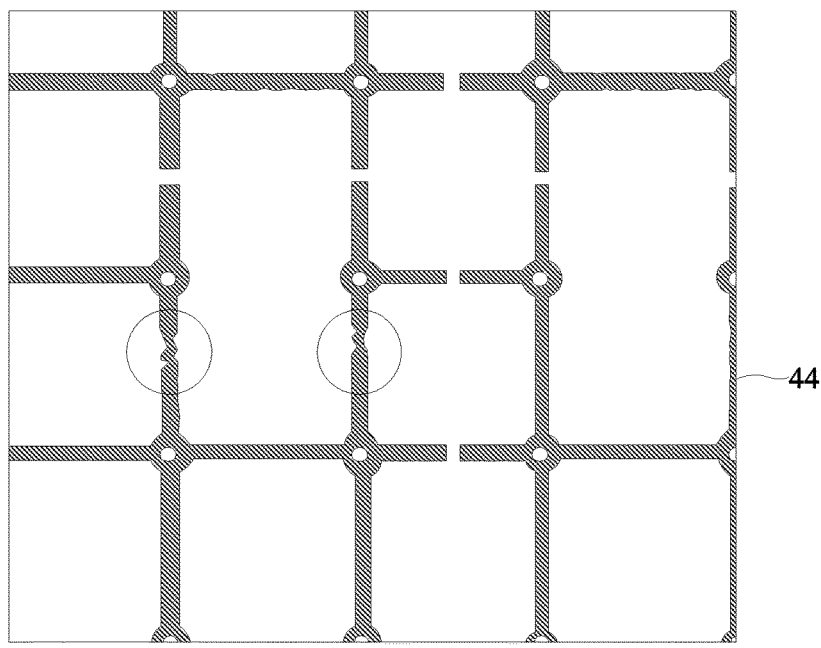
FIG. 28 is a structural diagram of a conductive layer in a touch structure of a display panel in the related art.

Moreover, during the process of forming the conductive layer 44, a dry etching process is used for patterning the conductive layer 44. The etching gas used in the dry etching process includes chlorine. Chloride ions are easily adsorbed on the organic layer 43, an acid is generated when the chloride ions meet water, and the acid will corrode the conductive layer 44 (referring to FIG. 28, the conductive layer 44 has a metal mesh structure, and mesh lines of the metal mesh in the circle are corroded). Therefore, the protective pad layer 205 is disposed between the conductive layer 44 and the organic layer 43 of the touch functional layer group 40, and the orthographic projection of the protective pad layer 205 on the organic layer 43 at least partially overlaps with the orthographic projection of the conductive layer 44 on the organic layer 43, which may reduce the contact area between the conductive layer 44 and the organic layer 43 under the conductive layer 44. As a result, during the process of etching the conductive layer 44, it may be possible to ameliorate the corrosion phenomenon of the conductive layer 44 caused by the acid on the organic layer 43 (referring to FIG. 26, the conductive layer 44 has a metal mesh structure, and no obvious corrosion phenomenon occurs on the mesh lines of the metal mesh).

The following embodiments of the present disclosure will be described by taking an example in which the display panel 2 adopts the FMLOC technology.

In some embodiments, as shown in FIGS. 2 and 3, the touch structure 4 has a touch region TA, and along a thickness direction Z of the display substrate 3, the touch region TA approximately coincides with the display region AA.

The touch structure 4 includes a plurality of touch units T disposed in the touch region TA. The plurality of touch units T includes a plurality of first touch units T1 and a plurality of second touch units T2, each first touch unit T1 extends along a first direction X, and the plurality of first touch units T1 are arranged side by side along the second direction Y. Each second touch unit T2 extends along the second direction Y, and the plurality of second touch units T2 are arranged side by side along the first direction X. The plurality of first touch units T1 are insulated from the plurality of second touch units T2.

The first touch unit T1 includes a plurality of first touch electrodes (touch sensing electrodes) T11 and a plurality of first connection portions T12, and two adjacent first touch electrodes T11 are electrically connected to each other through a first connection portion T12. The second touch unit T2 includes a plurality of second touch electrodes (touch driving electrodes) T21 and a plurality of second connection portions T22, and two adjacent second touch electrodes T21 are electrically connected to each other through a second connection portion T22. The touch IC recognizes a touch action of the finger by detecting changes in mutual capacitance values between the first touch electrodes T11 and the second touch electrodes T21, so as to realize the touch function of the display device.

The first direction X is consistent with a row direction of the plurality of sub-pixels arranged in an array in the display substrate 3.

As shown in FIG. 4A, the touch functional layer group(s) 40 of the touch structure 4 include a first touch functional layer group 41 and a second touch functional layer group 42. The first touch functional layer group 41 includes a first organic layer 201 and a first conductive layer 202 that are sequentially stacked. The second touch functional layer group 42 is disposed on a side of the first conductive layer 202 away from the first organic layer 201, and the second touch functional layer group 42 includes a second organic layer 203 and a second conductive layer 204 that are sequentially stacked.

The touch structure 4 further includes at least one protective pad layer 205, and the protective pad layer 205 corresponds to the first conductive layer 202 and/or the second conductive layer 204, so that the protective pad layer 205 is located between a conductive layer 44 and an organic layer 43 in a corresponding touch functional layer group 40.

It should be noted that the protective pad layer(s) 205 are arranged in one-to-one correspondence with the touch functional layer group(s) 40, and the protective pad layer 205 is also arranged corresponding to the conductive layer 44 and the organic layer 43 of the touch functional layer group 40.

For example, the protective pad layer 205 corresponds to the first touch functional layer group 41, so that the protective pad layer 205 also corresponds to the first conductive layer 202 and the first organic layer 201 of the first touch functional layer group 41.

As another example, the protective pad layer 205 corresponds to the second touch functional layer group 42, so that the protective pad layer 205 also corresponds to the second conductive layer 204 and the second organic layer 203 of the second touch functional layer group 42.

For example, as shown in FIG. 4A, the at least one protective pad layer 205 includes a first protective pad layer 2051, the first protective pad layer 2051 corresponds to the first conductive layer 202 of the first touch functional layer group 41, and the first protective pad layer 2051 is located between the first conductive layer 202 and the first organic layer 201.

Figure 8:
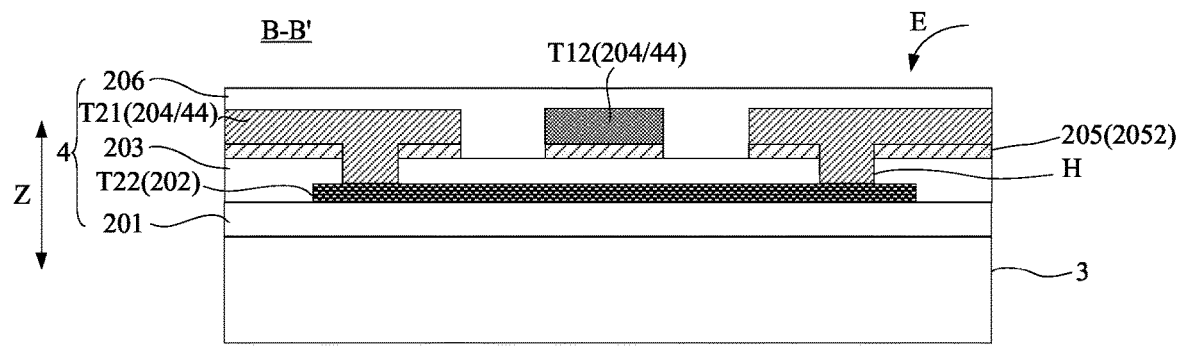
FIG. 8 is a sectional view of a display panel taken along the line B-B', in accordance with yet some other embodiments.

For example, as shown in FIG. 8, the at least one protective pad layer 205 includes a second protective pad layer 2052, the second protective pad layer 2052 corresponds to the second conductive layer 204, and the second protective pad layer 2052 is located between the second conductive layer 204 and the second organic layer 203.

Figure 11:
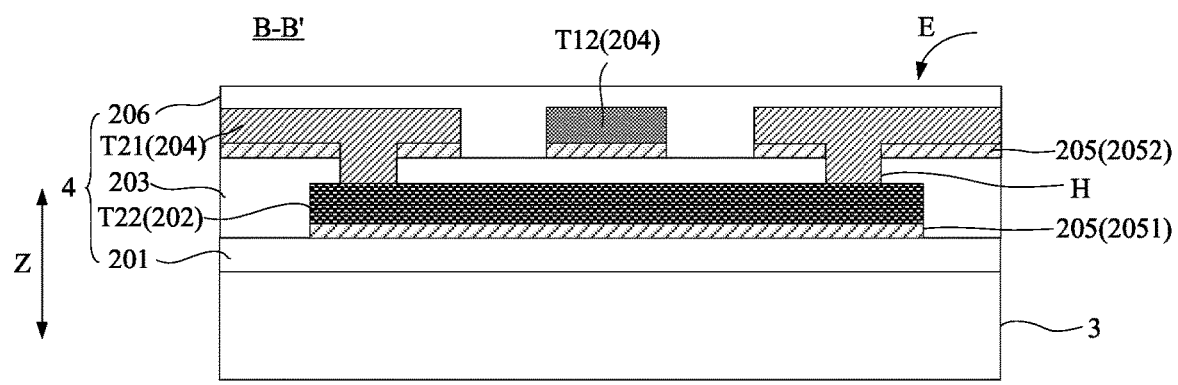

For example, as shown in FIG. 11, the touch structure 4 includes a first protective pad layer 2051 and a second protective pad layer 2052. The first protective pad layer 2051 corresponds to the first conductive layer 202, and the first protective pad layer 2051 is located between the first conductive layer 202 and the first organic layer 201. The second protective pad layer 2052 corresponds to the second conductive layer 204, and the second protective pad layer 2052 is located between the second conductive layer 204 and the second organic layer 203.

As shown in FIG. 4A, an orthographic projection of the protective pad layer 205 on the first organic layer 201 at least partially overlaps with an orthographic projection of the corresponding conductive layer 44 on the first organic layer 201.

For example, as shown in FIG. 4A, an orthographic projection of the first protective pad layer 2051 on the first organic layer 201 at least partially overlaps with an orthographic projection of the first conductive layer 202 on the first organic layer 201.

In the related art, the touch structure mainly adopts a first inorganic layer, a first conductive layer, a second inorganic layer and a second conductive layer that are sequentially stacked. The inventors of the present disclosure have found through research that, for some display panels with large-sized display screens, the voltage signals transmitted by the electrodes close to the touch structures in the display substrates (for example, the second electrodes 116 shown in FIG. 3) will interfere with the voltage signals transmitted by the first conductive layers and the second conductive layers in the touch structures, thereby affecting the touch performance of the touch structures. Moreover, the first inorganic layer and the second inorganic layer are both inorganic material layers, which have a poor bending performance, so that the display panel composed of the display substrate and the touch structure has a poor bending performance, which is not conducive to the preparation of the display panel with the curved screen.

Compared with the related art, in the embodiments of the present disclosure, the touch structure 4 includes the first touch functional layer group 41 and the second touch functional layer group 42 that are sequentially stacked. That is, the touch structure 4 includes the first organic layer 201, the first conductive layer 202, the second organic layer 203, and the second conductive layer 204 that are sequentially stacked. Since the resistivity of the organic material is greater than the resistivity of the inorganic material, by replacing the first inorganic layer with the first organic layer 201 and replacing the second inorganic layer with the second organic layer 203, it may be possible to reduce the interference of the voltage signals transmitted by the electrodes close to the touch structure 4 in the display substrate 3 to the voltage signals transmitted by the first conductive layer 202 and the second conductive layer 204 in the touch structure 4, and in turn improve the touch performance of the touch structure 4.

Moreover, the first organic layer 201 and the second organic layer 203 are both organic material layers, and the bending performance of the organic material layer is better than the bending performance of the inorganic material layer, so that it may be possible to improve the bending performance of the display panel 2 composed of the display substrate 3 and the touch structure 4, and in turn facilitate the preparation of the display panel 2 with the curved screen.

In addition, during the process of forming the conductive layer 44 (the first conductive layer 202 and the second conductive layer 204), the conductive layer 44 is patterned by using a dry etching process. The etching gas used in the dry etching process includes chlorine. Chloride ions are easily adsorbed on the organic layer 43, the chloride ions react with water to generate an acid, and the acid will corrode the conductive layer 44 (referring to FIG. 28, the conductive layer 44 has a metal mesh structure, and mesh lines of the metal mesh in the circle are corroded). Therefore, the protective pad layer 205 is disposed between the conductive layer 44 and the organic layer 43 of the touch functional layer group 40, and the orthographic projection of the protective pad layer 205 on the first organic layer 201 at least partially overlaps with the orthographic projection of the corresponding conductive layer 44 on the first organic layer 201, which may reduce the contact area between the conductive layer 44 and the organic layer 43 under the conductive layer 44. As a result, during the process of etching the conductive layer 44, it may be possible to ameliorate the corrosion phenomenon of the conductive layer 44 caused by the acid on the organic layer 43 (referring to FIG. 26, the conductive layer 44 has a metal mesh structure, and no obvious corrosion phenomenon occurs on the mesh lines of the metal mesh).

In some embodiments, a material of the first organic layer 201 and the second organic layer 203 includes at least one of polymethyl methacrylate, organosilicon compound, polyimide or epoxy resin.

In some embodiments, a thickness of the first organic layer 201 is in a range of 1 µm to 4 µm, such as 1 µm, 2 µm, 2.5 µm, 3 µm, or 4 µm.

In some embodiments, a thickness of the second organic layer 203 is in a range of 1 µm to 4 µm, such as 1 µm, 2 µm, 2.5 µm, 3 µm, or 4 µm.

In some embodiments, a material of the protective pad layer 205 includes an inorganic material. For example, the inorganic material may include silicon nitride.

It can be understood that the inorganic material is not easy to absorb chlorine ions, so that during the etching process of the conductive layer, a small amount of chlorine ions will be adsorbed on the inorganic material layer, which generates a low concentration acid when meeting water. Therefore, the protective pad layer 205 is made of the inorganic material, which may reduce the corrosion phenomenon of the conductive layer.

In some embodiments, the thickness of the protective pad layer 205 is less than the thickness of the organic layer 43 of the corresponding touch functional layer group 40. Therefore, since the thickness of the protective pad layer 205 is small, it is conducive to simplifying the film forming process and patterning process of the protective pad layer 205.

In addition, according to the above description, since the inorganic material layer has a poor bending performance, it may be possible to improve the bending performance of the display panel 2 composed of the display substrate 3 and the touch structure 4 by setting the protective pad layer 205 thinner.

For example, as shown in FIG. 4A, a thickness of the first protective pad layer 2051 is less than the thickness of the first organic layer 201.

For example, as shown in FIG. 8, a thickness of the second protective pad layer 2052 is less than the thickness of the second organic layer 203.

In some embodiments, the thickness of the protective pad layer 205 is in a range of 0.05 µm to 0.1 µm, such as 0.05 µm, 0.06 µm, 0.08 µm, 0.09 µm or 0.1 µm.

Figure 20:
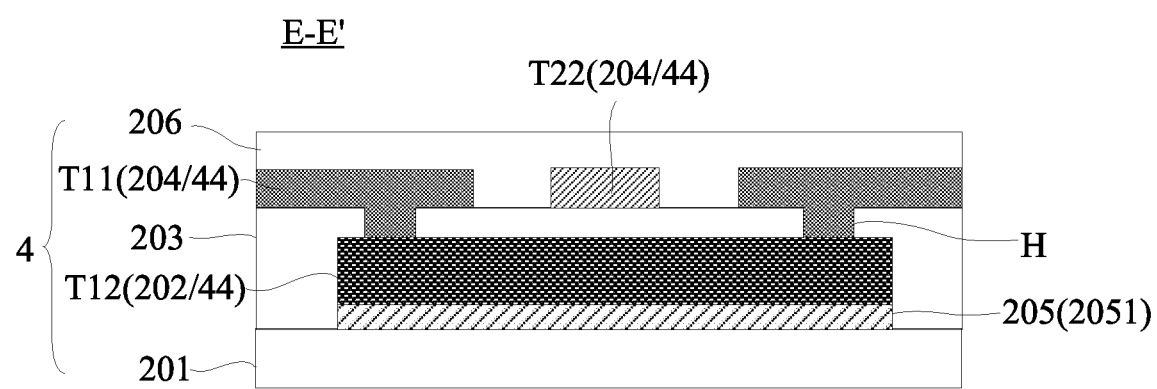
FIG. 20 is a sectional view of the display panel in FIG. 19 taken along the line E-E'.

In some embodiments, as shown in FIG. 20, the first conductive layer 202 and the second conductive layer 204 each have a metal mesh structure. The touch electrode of a metal mesh structure has low resistance and high sensitivity, which can improve the touch sensitivity of the touch structure 4. Moreover, the touch electrode of the metal mesh structure has high mechanical strength, which may reduce the weight of the touch structure 4.

In some embodiments, the first conductive layer 202 and the second conductive layer 204 may each have a single-layer structure. In some other embodiments, the first conductive layer 202 and the second conductive layer 204 may also each have a stacked structure. For example, the first conductive layer 202 and the second conductive layer 204 may each include a titanium metal layer, an aluminum metal layer and another titanium metal layer that are sequentially stacked.

In some embodiments, as shown in FIG. 4A, at least the orthographic projection of the corresponding conductive layer 44 on the first organic layer 201 is located in the orthographic projection of the protective pad layer 205 on the first organic layer 201.

In this way, the protective pad layer 205 may separate the conductive layer 44 from the organic layer 43 under the protective pad layer 205, thus avoiding the corrosion of the conductive layer 44 by the acid on the organic layer 43 during the etching process of the conductive layer 44.

In some embodiments, as shown in FIGS. 4A and 8, the orthographic projection of the protective pad layer 205 on the first organic layer 201 approximately coincides with the orthographic projection of the corresponding conductive layer 44 on the first organic layer 201.

It can be understood that the orthographic projection of the protective pad layer 205 on the first organic layer 201 approximately coincides with the orthographic projection of the corresponding conductive layer 44 on the first organic layer 201, so that a contour of the protective pad layer 205 is approximately the same as a contour of the corresponding conductive layer 44, and the protective pad layer 205 may exactly separate the corresponding conductive layer 44 and the organic layer 43 under the conductive layer 44. Therefore, during the process of etching the conductive layer 44, it may be possible to avoid the problem of the corrosion of the conductive layer 44 caused by the acid on the organic layer 43.

Figure 27:
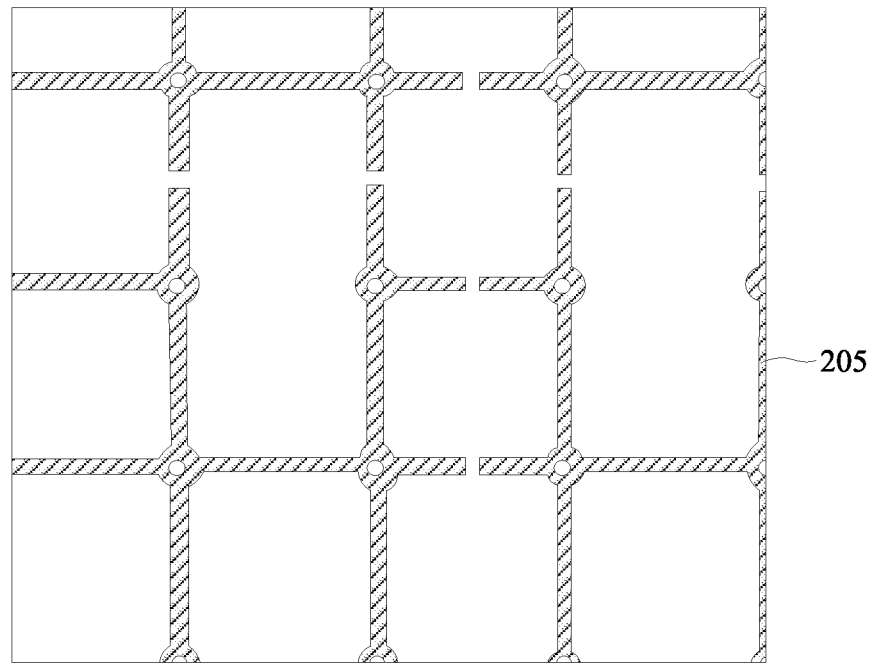
FIG. 27 is a structural diagram of a protective pad layer in a touch structure of a display panel, in accordance with some embodiments of the present disclosure.

Moreover, in a case where the first conductive layer 202 and the second conductive layer 204 have metal mesh structures, the contour of the protective pad layer 205 is approximately the same as the contour of the corresponding conductive layer 44, and as shown in FIG. 27, the protective pad layer 205 is also in a shape of a mesh.

Figure 6:
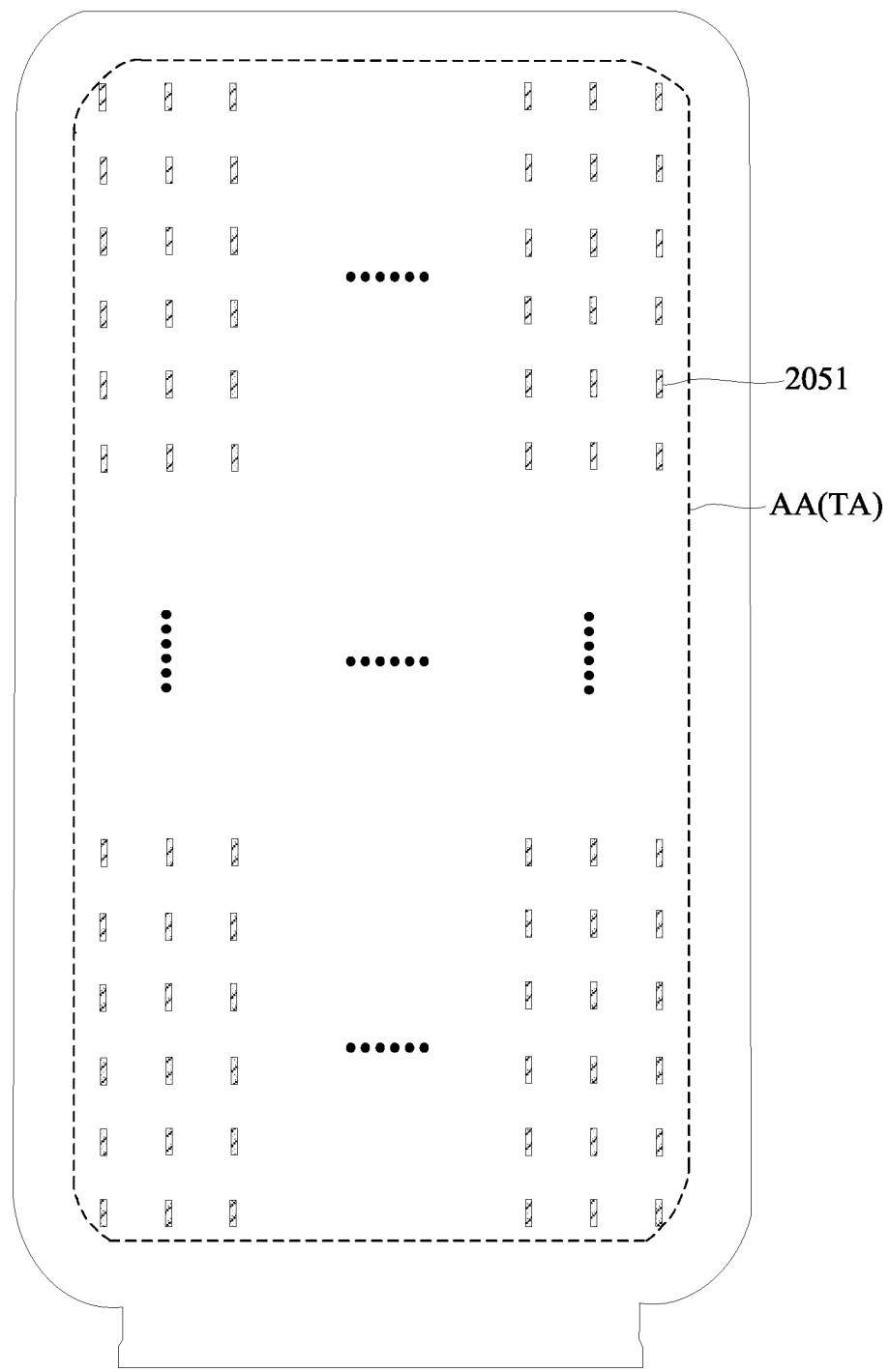
FIG. 6 is a top view of a plurality of first protective pad layers of the touch structure in FIG. 4A.

For example, as shown in FIG. 4A, the orthographic projection of the first protective pad layer 2051 on the first organic layer 201 approximately coincides with the orthographic projection of the first conductive layer 202 on the first organic layer 201. In this case, FIG. 6 shows the arrangement of the first protective pad layers 2051 in the touch region TA.

Figure 9:
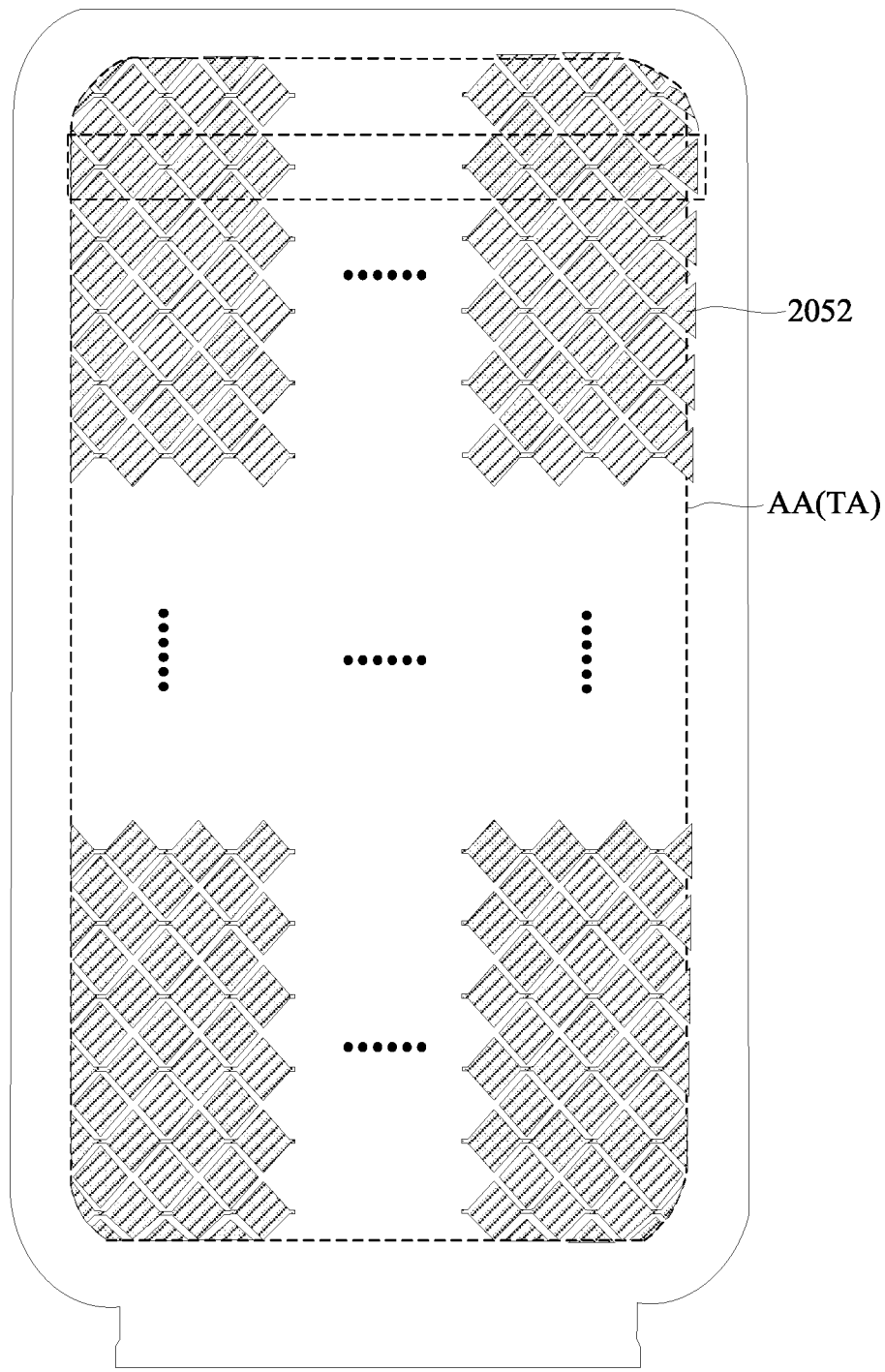
FIG. 9 is a top view of a plurality of second protective pad layers of the touch structure in FIG. 8.

For example, as shown in FIG. 8, the orthographic projection of the second protective pad layer 2052 on the first organic layer 201 approximately coincides with the orthographic projection of the second conductive layer 204 on the first organic layer 201. In this case, FIG. 9 shows the arrangement of the second protective pad layers 2052 in the touch region TA.

Figure 7:
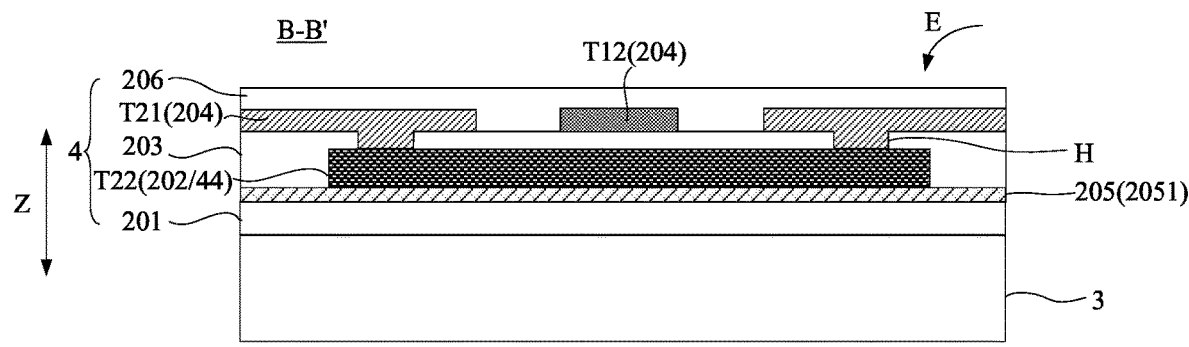
FIG. 7 is a sectional view of a display panel taken along the line B-B', in accordance with yet some other embodiments.
Figure 10:
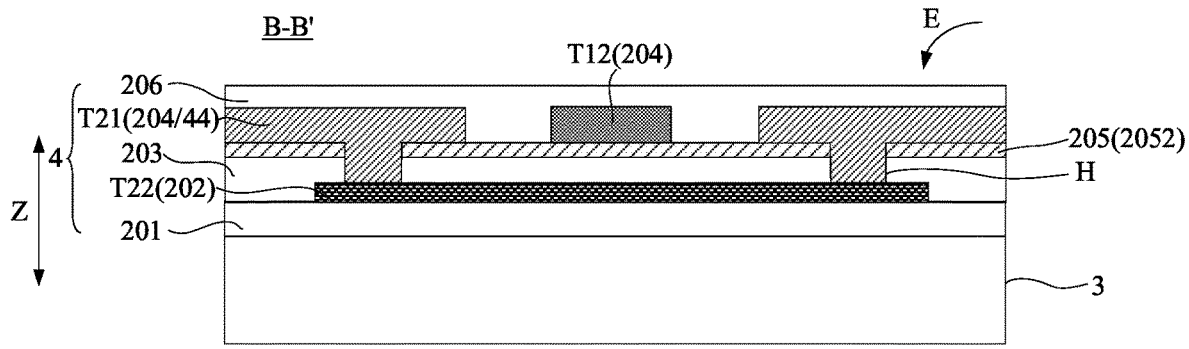
FIGS. 10 to 14 are sectional views of various display panels taken along the line B-B', in accordance with some embodiments.

In some embodiments, as shown in FIGS. 7 and 10, the orthographic projection of the protective pad layer 205 on the first organic layer 201 is a closed shape, and the orthographic projection of the conductive layer 44 corresponding to the protective pad layer 205 on the first organic layer 201 is located within the boundary of the closed shape.

It should be noted that the term "closed shape" refers to a figure that is in a closed state in its dimension and is a closed figure composed of N line segments or arcs (N is a positive integer). Therefore, the orthographic projection of the protective pad layer 205 on the first organic layer 201 is a closed shape, which means that the protective pad layer 205 is an entire film layer and there is no hollowed-out portion inside the protective pad layer 205.

In the above embodiments of the present disclosure, the orthographic projection of the protective pad layer 205 on the first organic layer 201 is a closed shape, and the orthographic projection of the conductive layer 44 corresponding to the protective pad layer 205 on the first organic layer 201 is located within the boundary of the closed shape, so that the protective pad layer 205 can better separate the corresponding conductive layer 44 and the organic layer 43 located under the conductive layer 44. As a result, during the process of etching the conductive layer 44, it may be possible to avoid the problem that the conductive layer 44 is corroded by acid when being in contact with the organic layer 43.

For example, the orthographic projection of the protective pad layer 205 on the first organic layer 201 approximately coincides with the orthographic projection of the organic layer 43 corresponding to the protective pad layer 205 on the first organic layer 201, so that the protective pad layer 205 covers the organic layer 43 located under the conductive layer 44. As a result, during the process of etching the conductive layer 44, it may be possible to avoid the problem that the conductive layer 44 is corroded by acid when being in contact with the organic layer 43.

In some embodiments, as shown in FIG. 2, the touch structure 4 has a bonding region BD located on a side of the touch region TA. The orthographic projection of the protective pad layer 205 on the first organic layer 201 and the bonding region BD are staggered.

It can be understood that the display panel 2 is provided therein with a plurality of pins 5 located in the bonding region BD, and is bonded to a flexible printed circuit board (FPC) through the plurality of pins 5, so as to receive voltage signals from the flexible printed circuit board. Since the orthographic projection of the protective pad layer 205 on the first organic layer 201 and the bonding region BD are staggered from each other, the protective pad layer 205 may expose the plurality of pins 5, which facilitates the bonding of the plurality of pins 5 to the flexible printed circuit board.

In some embodiments, as shown in FIG. 4A, the first protective pad layer 2051 is arranged corresponding to the first conductive layer 202, and no protective pad layer 205 is arranged under the second conductive layer 204. The orthographic projection of the first protective pad layer 2051 on the first organic layer 201 approximately coincides with the orthographic projection of the first conductive layer 202 on the first organic layer 201.

In some embodiments, as shown in FIG. 7, the first protective pad layer 2051 is arranged corresponding to the first conductive layer 202, and no protective pad layer 205 is arranged under the second conductive layer 204. The orthographic projection of the first protective pad layer 2051 on the first organic layer 201 is a closed shape; and the orthographic projection of the first conductive layer 202 on the first organic layer 201 is located within a boundary of the closed shape, and is staggered from the bonding region BD.

In some embodiments, as shown in FIG. 8, no protective pad layer 205 is arranged under the first conductive layer 202, and the second protective pad layer 2052 is arranged corresponding to the second conductive layer 204. The orthographic projection of the second protective pad layer 2052 on the first organic layer 201 approximately coincides with the orthographic projection of the second conductive layer 204 on the first organic layer 201.

In some embodiments, as shown in FIG. 10, no protective pad layer 205 is arranged under the first conductive layer 202, and the second protective pad layer 2052 is arranged corresponding to the second conductive layer 204. The orthographic projection of the second protective pad layer 2052 on the first organic layer 201 is a closed shape; and the orthographic projection of the second conductive layer 204 on the first organic layer 201 is located within a boundary of the closed shape, and is staggered from the bonding region BD.

In some embodiments, as shown in FIG. 11, the first protective pad layer 2051 is arranged corresponding to the first conductive layer 202, and the second protective pad layer 2052 is arranged corresponding to the second conductive layer 204. The orthographic projection of the first protective pad layer 2051 on the first organic layer 201 approximately coincides with the orthographic projection of the first conductive layer 202 on the first organic layer 201. The orthographic projection of the second protective pad layer 2052 on the first organic layer 201 approximately coincides with the orthographic projection of the second conductive layer 204 on the first organic layer 201.

Figure 12:
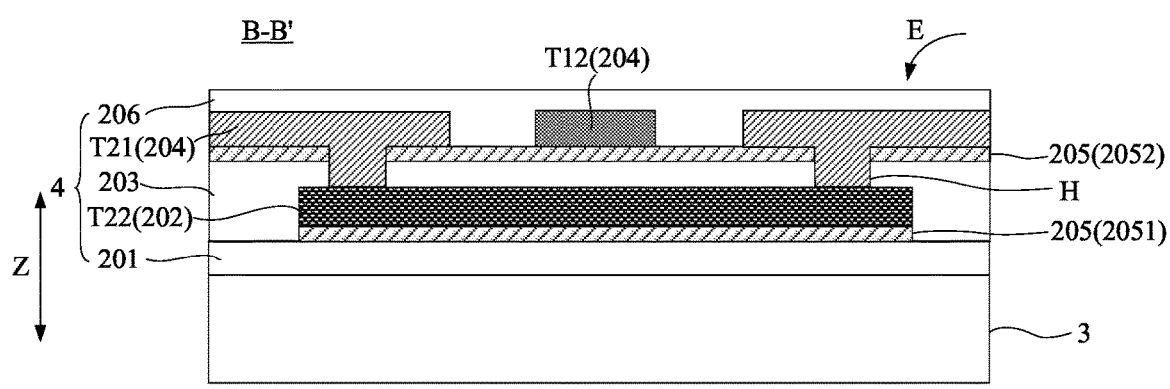

In some embodiments, as shown in FIG. 12, the first protective pad layer 2051 is arranged corresponding to the first conductive layer 202, and the second protective pad layer 2052 is arranged corresponding to the second conductive layer 204. The orthographic projection of the first protective pad layer 2051 on the first organic layer 201 approximately coincides with the orthographic projection of the first conductive layer 202 on the first organic layer 201. The orthographic projection of the second protective pad layer 2052 on the first organic layer 201 is a closed shape; and the orthographic projection of the second conductive layer 204 on the first organic layer 201 is located within the boundary of the closed shape, and is staggered from the bonding region BD.

Figure 13:
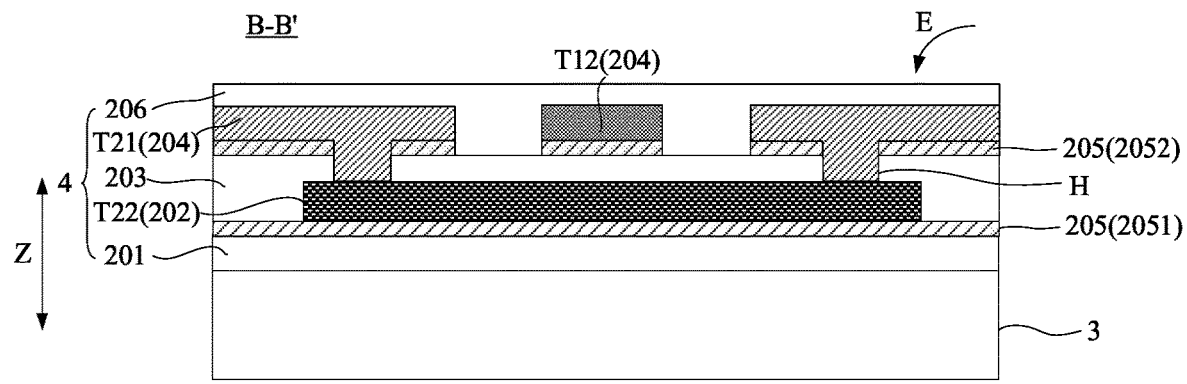

In some embodiments, as shown in FIG. 13, the first protective pad layer 2051 is arranged corresponding to the first conductive layer 202, and the second protective pad layer 2052 is arranged corresponding to the second conductive layer 204. The orthographic projection of the first protective pad layer 2051 on the first organic layer 201 is a closed shape; and the orthographic projection of the first conductive layer 202 on the first organic layer 201 is located within the boundary of the closed shape, and is staggered from the bonding region BD. The orthographic projection of the second protective pad layer 2052 on the first organic layer 201 approximately coincides with the orthographic projection of the second conductive layer 204 on the first organic layer 201.

Figure 14:
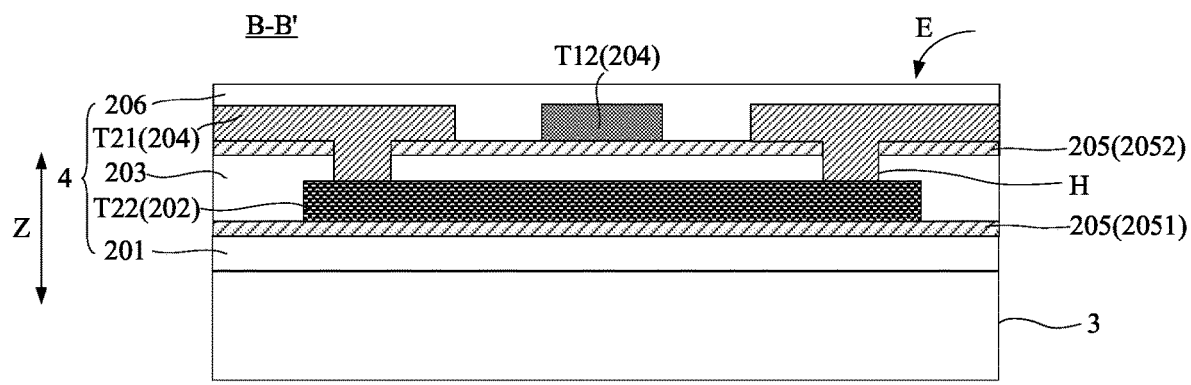

In some embodiments, as shown in FIG. 14, the first protective pad layer 2051 is arranged corresponding to the first conductive layer 202, and the second protective pad layer 2052 is arranged corresponding to the second conductive layer 204. The orthographic projection of the first protective pad layer 2051 on the first organic layer 201 is a closed shape; and the orthographic projection of the first conductive layer 202 on the first organic layer 201 is located within the boundary of the closed shape, and is staggered from the bonding region BD. The orthographic projection of the second protective pad layer 2052 on the first organic layer 201 is a closed shape; and the orthographic projection of the second conductive layer 204 on the first organic layer 201 is located within the boundary of the closed shape, and is staggered from the bonding region BD.

According to the above description, during the process of forming the conductive layer 44, the conductive layer 44 is patterned by using a dry etching process, and the etching gas used in the dry etching process includes chlorine. Therefore, the smaller the thickness of the conductive layer 44, the shorter the etching time, the less the chlorine ions adsorbed on the organic layer 43, and the lower the concentration of the acid generated when the chlorine ions meet water. Conversely, the larger the thickness of the conductive layer 44, the longer the etching time, the more the chlorine ions adsorbed on the organic layer 43, and the higher the concentration of the acid generated when the chlorine ions meet water.

Based on this, in some embodiments, as shown in FIGS. 4A and 8, in the first conductive layer 202 and the second conductive layer 204, compared with the conductive layer 44 that is arranged corresponding to no protective pad layer 205, the conductive layer 44 that is arranged corresponding to the protective pad layer 205 may have a larger thickness.

For example, the thickness of the conductive layer 44 arranged corresponding to the protective pad layer 205 is greater than or equal to 0.3 µm, such as 0.3 µm, 0.5 µm, 0.6 µm, 0.8 µm or 1.0 µm.

It can be understood that, since the protective pad layer 205 is arranged between the conductive layer 44 and the organic layer 43, the thickness of the conductive layer 44 may be large. During the process of etching the conductive layer 44, even if the organic layer 43 meets water to generate an acid with a higher concentration, the conductive layer 44 will not be corroded.

In addition, since the thickness of the conductive layer 44 is large, the resistance of the conductive layer 44 may be reduced, which may reduce the voltage drop generated when the conductive layer 44 transmits a voltage signal, and it is conducive to improving the touch performance of the touch structure 4.

For example, as shown in FIG. 4A, the first protective pad layer 2051 is arranged corresponding to the first conductive layer 202, and the first conductive layer 202 may have a large thickness.

For example, as shown in FIG. 8, the second protective pad layer 2052 is arranged corresponding to the second conductive layer 204, and the second conductive layer 204 may have a large thickness.

In some embodiments, as shown in FIGS. 4A and 8, the protective pad layer 205 is arranged corresponding to one of the first conductive layer 202 and the second conductive layer 204, and the thickness of the conductive layer 44 corresponding to the protective pad layer 205 is greater than the thickness of another conductive layer 44 corresponding to no protective pad layer 205.

It can be understood that, one of the first conductive layer 202 and the second conductive layer 204 is arranged corresponding to the protective pad layer 205, and the other one is arranged corresponding to no protective pad layer 205. According to the above description, with respect to the conductive layer 44 that is arranged corresponding to no protective pad layer 205, the thickness of the conductive layer 44 that is arranged corresponding to the protective pad layer 205 may be larger. Conversely, with respect to the conductive layer 44 that is arranged corresponding to the protective pad layer 205, the thickness of the conductive layer 44 that is arranged corresponding to no protective pad layer 205 may be smaller. Therefore, the thickness of the conductive layer 44 that is arranged corresponding to the protective pad layer 205 is greater than the thickness of the conductive layer 44 that is arranged corresponding to no protective pad layer 205. In the above embodiments of the present disclosure, since the thickness of the conductive layer 44 is small, the time for etching the conductive layer 44 may be shortened, so as to reduce the chlorine ions adsorbed on the organic layer 43 and reduce the concentration of the acid generated when the chlorine ions on the organic layer 43 meet water. In this case, there may be no protective pad layer 205 between the conductive layer 44 and the organic layer 43 under the conductive layer 44, which means that the conductive layer 44 may be in direct contact with the organic layer 43, and the conductive layer 44 has a slight corrosion phenomenon.

For example, as shown in FIG. 4A, the first conductive layer 202 corresponds to the protective pad layer 205, the second conductive layer 204 corresponds to no protective pad layer 205, and the thickness of the first conductive layer 202 is greater than the thickness of the second conductive layer 204.

For example, as shown in FIG. 8, the first conductive layer 202 corresponds to no protective pad layer 205, the second conductive layer 204 corresponds to the protective pad layer 205, and the thickness of the second conductive layer 204 is greater than the thickness of the first conductive layer 202.

In some embodiments, as shown in FIGS. 4A and 8, the protective pad layer 205 is arranged corresponding to one of the first conductive layer 202 and the second conductive layer 204, and no protective pad layer 205 is correspondingly arranged under another of the first conductive layer 202 and the second conductive layer 204. With respect to the conductive layer 44 that is arranged corresponding to the protective pad layer 205, the thickness of the conductive layer 44 that is arranged corresponding to no protective pad layer 205 is smaller.

For example, the thickness of the conductive layer 44 that is arranged corresponding to no protective pad layer 205 is less than 0.3 μm, such as 0.1 μm, 0.15 μm, 0.2 μm, 0.26 μm or 0.28 μm.

Figure 5:
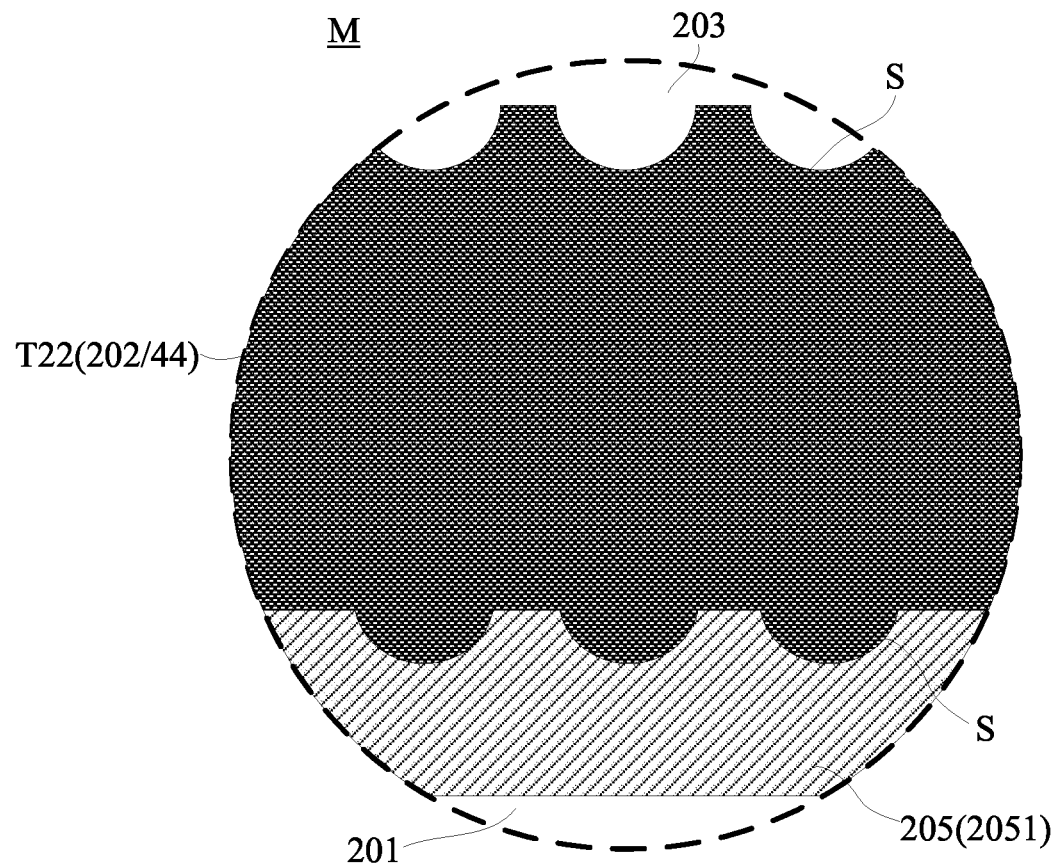
FIG. 5 is a partial enlarged view of the region M in FIG. 4A.

In some embodiments, as shown in FIG. 5, a surface of the protective pad layer 205 proximate to the corresponding conductive layer 44 has a plurality of depressions S, and a surface of the conductive layer 44 away from the corresponding protective pad layer 205 has a plurality of depressions S.

It should be noted that, in the process of forming the protective pad layer 205, a chemical vapor deposition (CVD) process is adopted, which means that high-speed moving ions are used to bombard a target material, so that the protective pad layer 205 is formed after the target material is deposited, and a surface of the protective pad layer 205 away from the first organic layer 201 is bombarded with the high-speed moving ions to obtain a plurality of depressions S. Therefore, the conductive layer 44 is formed on the protective pad layer 205, and the conductive layer 44 is attached to a surface of the protective pad layer 205 due to gravity, so that the surface of the conductive layer 44 away from the corresponding protective pad layer 205 has the plurality of depressions S.

In this way, since the surface of the conductive layer 44 away from the corresponding protective pad layer 205 has the plurality of depressions S, the surface roughness of the conductive layer 44 is improved, which may reduce the reflection of the conductive layer 44 to external ambient light, and in turn reduce the impact on the display images of the display panel 2.

The arrangement of the plurality of touch units T in the first conductive layer 202 and the second conductive layer 204 will be described below.

In some embodiments, as shown in FIGS. 2, 4A, 15 and 16, the plurality of first touch electrodes T11, the plurality of second touch electrodes T21 and the plurality of first connection portions T12 are arranged in one of the first conductive layer 202 and the second conductive layer 204, and the plurality of second connection portions T22 are arranged in another of the first conductive layer 202 and the second conductive layer 204.

Adjacent two first touch electrodes T11 are electrically connected to each other through a first connection portion T12. The second connection portion T22 is electrically connected to adjacent two second touch electrodes T21 through via holes H in the second organic layer 203.

For example, as shown in FIGS. 2 and 4A, the plurality of first touch electrodes T11, the plurality of second touch electrodes T21 and the plurality of first connection portions T12 are arranged in the second conductive layer 204, and the plurality of second connection portions T22 are arranged in the first conductive layer 202.

It can be understood that the second conductive layer 204 is farther away from the display substrate 3 than the first conductive layer 202, and the plurality of first touch electrodes T11 and the plurality of second touch electrodes T21 are arranged in the second conductive layer 204; therefore, it may be possible to reduce the interference of the voltage signals transmitted by the electrodes close to the touch structure 4 in the display substrate 3 to the voltage signals transmitted by the first touch electrode T11 and the second touch electrode T21.

In addition, the second conductive layer 204 is closer to a surface of the display panel 2 than the first conductive layer 202, and the plurality of first touch electrodes T11 and the plurality of second touch electrodes T21 are arranged in the second conductive layer 204; therefore, when the finger touches the surface of the display panel 2, it is beneficial for the finger to take away the charges on the first touch electrode T11 and the second touch electrode T21, and in turn improving the touch sensitivity of the touch structure 4.

Figure 15:
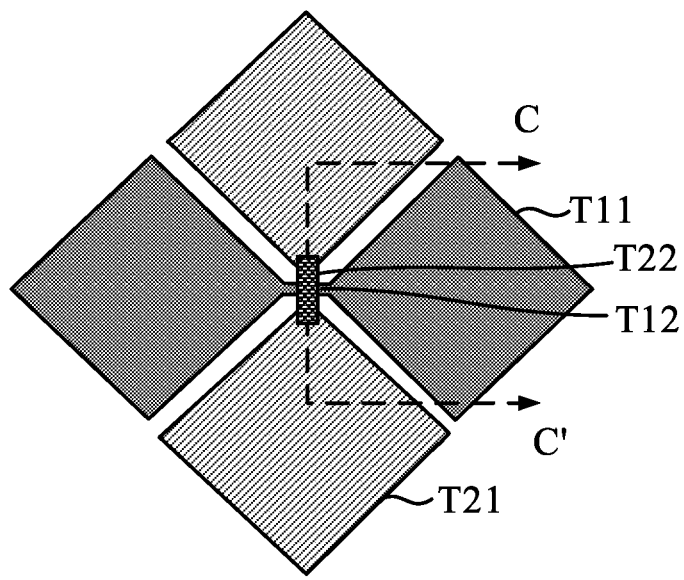
FIG. 15 is a structural diagram of another display panel, in accordance with some embodiments.
Figure 16:
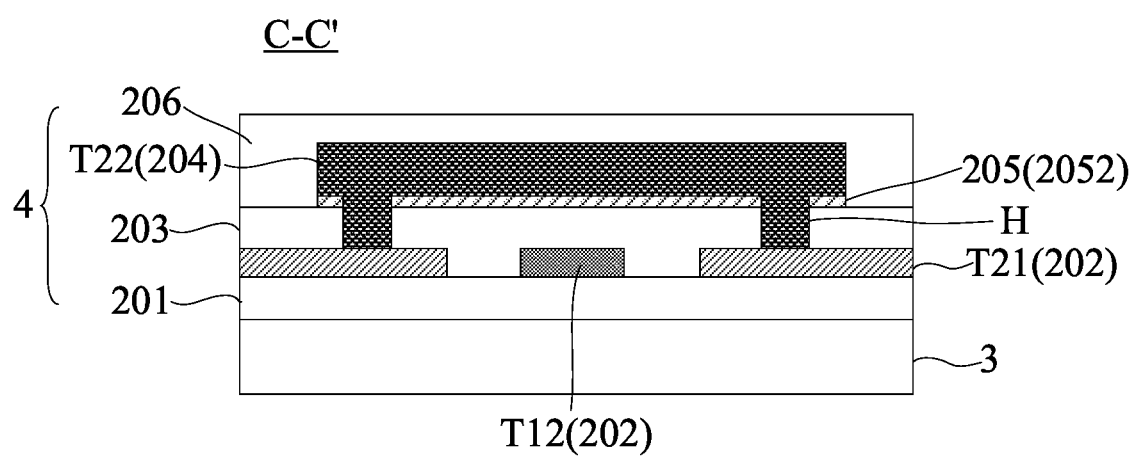
FIG. 16 is a sectional view of the display panel in FIG. 15 taken along the line C-C'.

For example, as shown in FIGS. 15 and 16, the plurality of first touch electrodes T11, the plurality of second touch electrodes T21 and the plurality of first connection portions T12 are arranged in the first conductive layer 202, and the plurality of second connection portions T22 are arranged in the second conductive layer 204.

In some embodiments, as shown in FIGS. 17 to 20, the plurality of first touch electrodes T11, the plurality of second touch electrodes T21 and the plurality of second connection portions T22 are arranged in one of the first conductive layer 202 and the second conductive layer 204, and the plurality of first connection portions T12 are arranged in another of the first conductive layer 202 and the second conductive layer 204.

The first connection portion T12 is electrically connected to adjacent two first touch electrodes T11 through via holes H in the second organic layer 203. Adjacent two second touch electrodes T21 are directly electrically connected to each other through a second connection portion T22.

Figure 17:
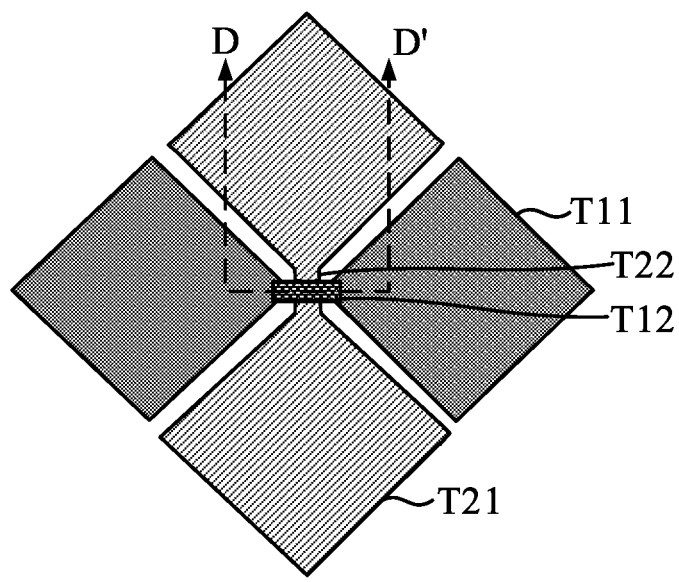
FIG. 17 is a structural diagram of yet another display panel, in accordance with some embodiments.
Figure 18:
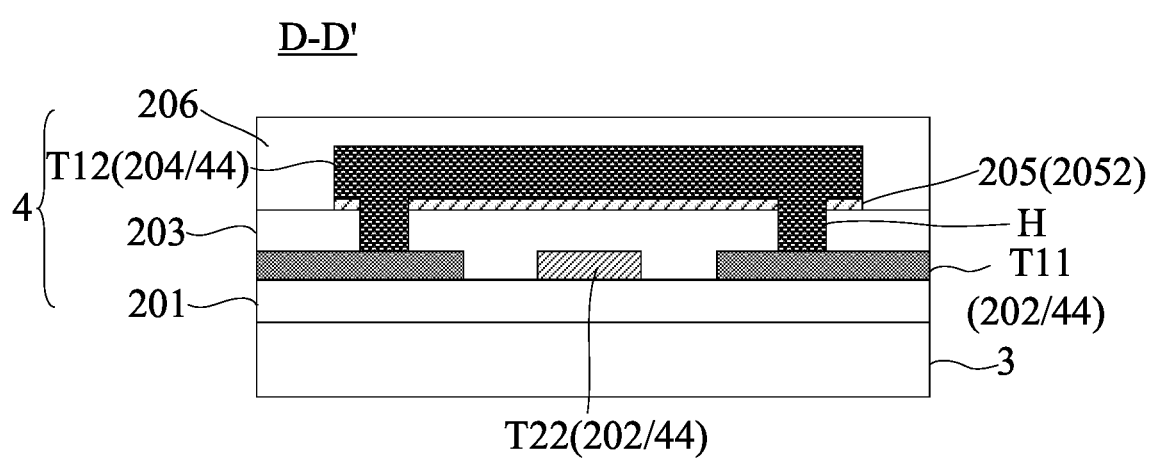
FIG. 18 is a sectional view of the display panel in FIG. 17 taken along the line D-D'.

For example, as shown in FIGS. 17 and 18, the plurality of first touch electrodes T11, the plurality of second touch electrodes T21 and the plurality of second connection portions T22 are arranged in the first conductive layer 202, and the plurality of first connection portions T12 are arranged in the second conductive layer 204.

Figure 19:
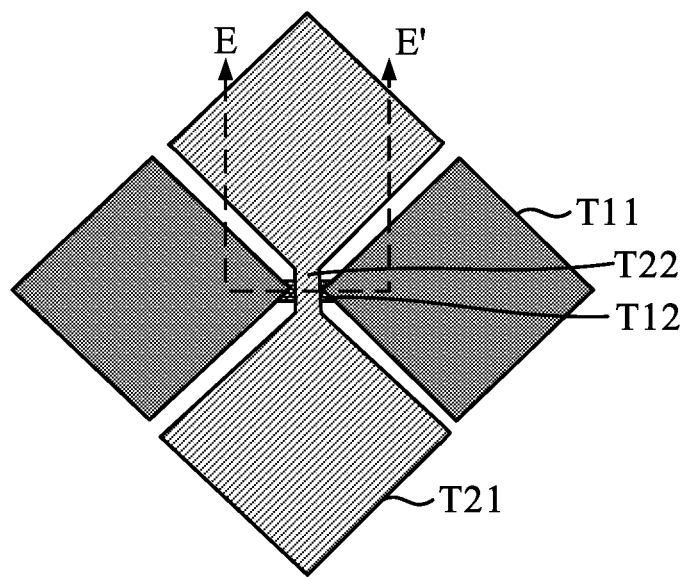
FIG. 19 is a structural diagram of yet another display panel, in accordance with some embodiments.

For example, as shown in FIGS. 19 and 20, the plurality of first touch electrodes T11, the plurality of second touch electrodes T21 and the plurality of second connection portions T22 are arranged in the second conductive layer 204, and the plurality of first connection portions T12 are arranged in the first conductive layer 202.

In some embodiments, as shown in FIGS. 4A and 16, the plurality of first touch electrodes T11, the plurality of second touch electrodes T21 and the plurality of first connection portions T12 are arranged in the same conductive layer 44, and the conductive layer 44 where the plurality of second connection portions T22 are located is correspondingly provided therein with protective pad layers 205.

It can be understood that two adjacent first touch electrodes T11 are directly electrically connected through the first connection portion T12, and the second connection portion T22 is electrically connected to two adjacent second touch electrodes T21 through via holes H in the second organic layer 203. That is, the second connection portion T22 is used as a bridging electrode to electrically connect two adjacent second touch electrodes T21 cross the first connection portion T12.

By arranging the protective pad layer 205 under the conductive layer 44 where the second connecting portion T22 is located, according to the foregoing, the thickness of the second connecting portion T22 may be increased to reduce the resistance of the second connecting portion T22; therefore, the voltage drop generated during the transmission of the voltage signal on the second connection portion T22 is reduced, which is conducive to improving the touch performance of the touch structure 4.

In some embodiments, as shown in FIGS. 18 and 20, the plurality of first touch electrodes T11, the plurality of second touch electrodes T21 and the plurality of second connection portions T22 are arranged in the same conductive layer 44, and the conductive layer 44 where the plurality of first connection portions T12 are located is correspondingly provided therein with protective pad layers 205.

It can be understood that the first connection portion T12 is electrically connected to two adjacent first touch electrodes T11 through via holes H in the second organic layer 203. Two adjacent second touch electrodes T21 are directly electrically connected to each other through the second connection portion T22. In this case, the first connection portion T12 is used as a bridging electrode to electrically connect two adjacent first touch electrodes T11 cross the second connection portion T22.

The principle is the same as that of the previous embodiments. By arranging the protective pad layer 205 under the conductive layer 44 where the first connection portion T12 is located, the thickness of the first connection portion T12 may be increased to reduce the resistance of the first connection portion T12; therefore, the voltage drop generated during the transmission of the voltage signal on the first connection portion T12 is reduced, which is conducive to improving the touch performance of the touch structure 4.

Figure 21:
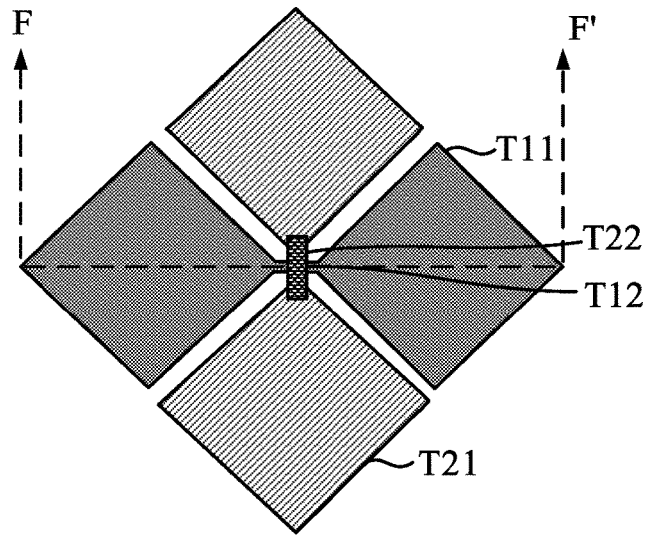
FIG. 21 is a structural diagram of yet another display panel, in accordance with some embodiments.
Figure 22:
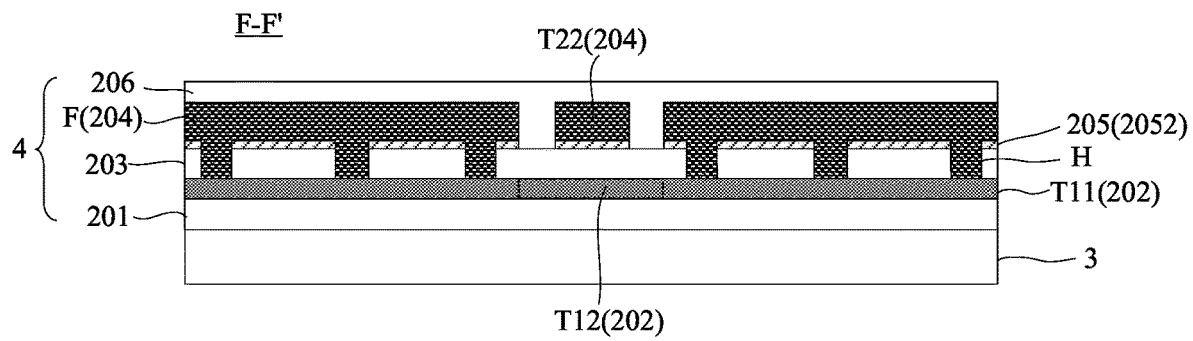
FIG. 22 is a sectional view of the display panel in FIG. 21 taken along the line F-F'.

In some embodiments, as shown in FIGS. 21 and 22, the touch structure 4 further includes a plurality of auxiliary electrodes F. The plurality of first touch electrodes T11 and the plurality of second touch electrodes T21 are arranged in one of the first conductive layer 202 and the second conductive layer 204, and the plurality of auxiliary electrodes F are arranged in another of the first conductive layer 202 and the second conductive layer 204. An orthographic projection of each auxiliary electrode F on the first organic layer 201 at least partially overlaps an orthographic projection of a first touch electrode T11 or a second touch electrode T21 on the first organic layer 201. That is, each auxiliary electrode F corresponds to a touch electrode. The auxiliary electrode F is electrically connected to the corresponding touch electrode (the first touch electrode T11 or the second touch electrode T21) through via hole(s) H in the second organic layer 203.

In this way, the auxiliary electrode F is connected in parallel with the first touch electrode T11 or the second touch electrode T21, which may reduce the resistance of the first touch electrode T11 or the resistance of the second touch electrode T21. Therefore, the voltage drop generated during the transmission of the voltage signal on the first touch electrode T11 or the second touch electrode T21 may be reduced, which is conducive to improving the touch performance of the touch structure 4.

For example, as shown in FIG. 22, the plurality of first touch electrodes T11 and the plurality of second touch electrodes T21 are arranged in the first conductive layer 202, and the plurality of auxiliary electrodes F are arranged in the second conductive layer 204.

For example, the plurality of first touch electrodes T11 and the plurality of second touch electrodes T21 are arranged in the second conductive layer 204, and the plurality of auxiliary electrodes F are arranged in the first conductive layer 202.

In some embodiments, the first touch electrodes T11 and the second touch electrodes T21 are arranged in the first conductive layer 202, the first connection portions T12 are arranged in one of the first conductive layer 202 and the second conductive layer 204, and the second connection portions T22 are arranged in another of the first conductive layer 202 and the second conductive layer 204.

Figure 23:
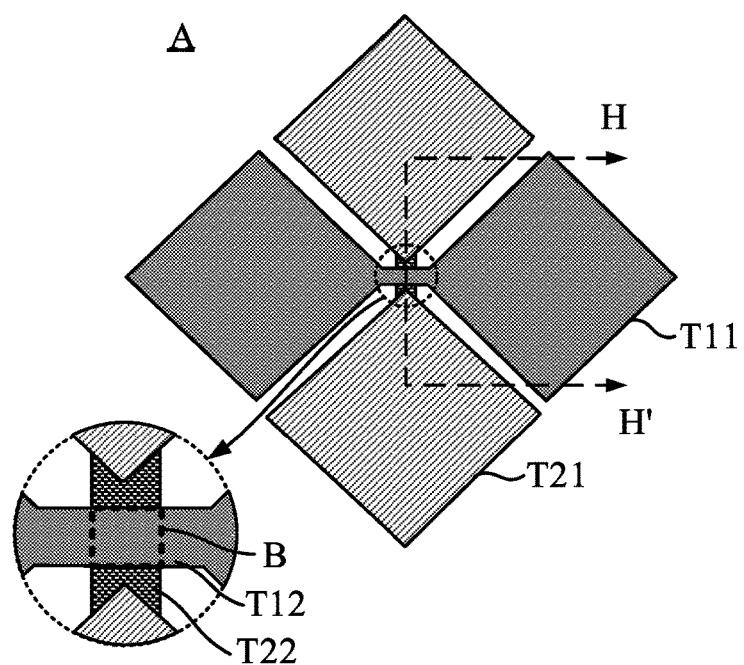
FIG. 23 is a structural diagram of yet another display panel, in accordance with some embodiments.
Figure 24:
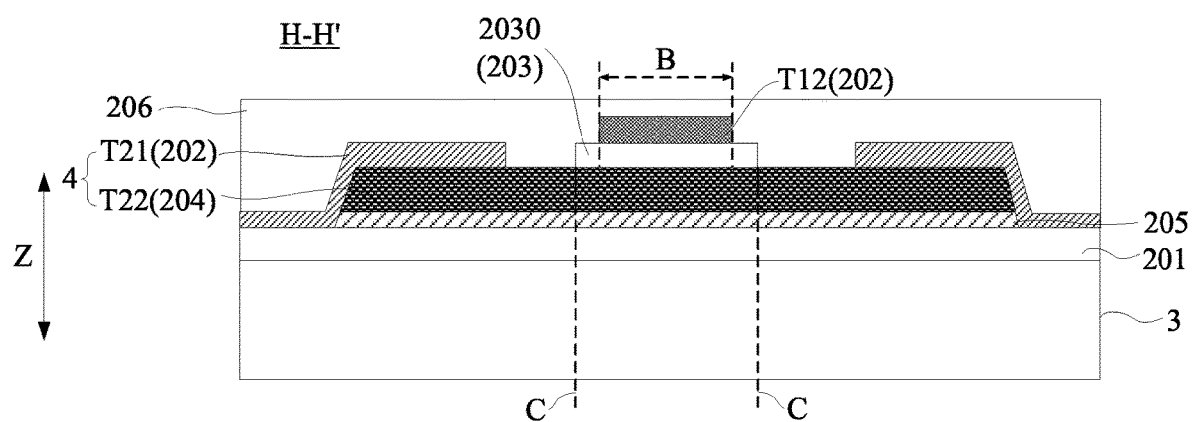
FIG. 24 is a sectional view of the display panel in FIG. 23 taken along the line H-H'.

For example, as shown in FIGS. 23 and 24, the first connection portions T12 are arranged in the first conductive layer 202, and the second connection portions T22 are arranged in the second conductive layer 204.

Referring to FIGS. 23 and 24, an orthographic projection of a first connection portion T12 on the display substrate 3 overlaps with an orthographic projection of a second connection portion T22 on the display substrate 3, and a region determined by overlapping portions is an overlapping region B.

Figure 25:
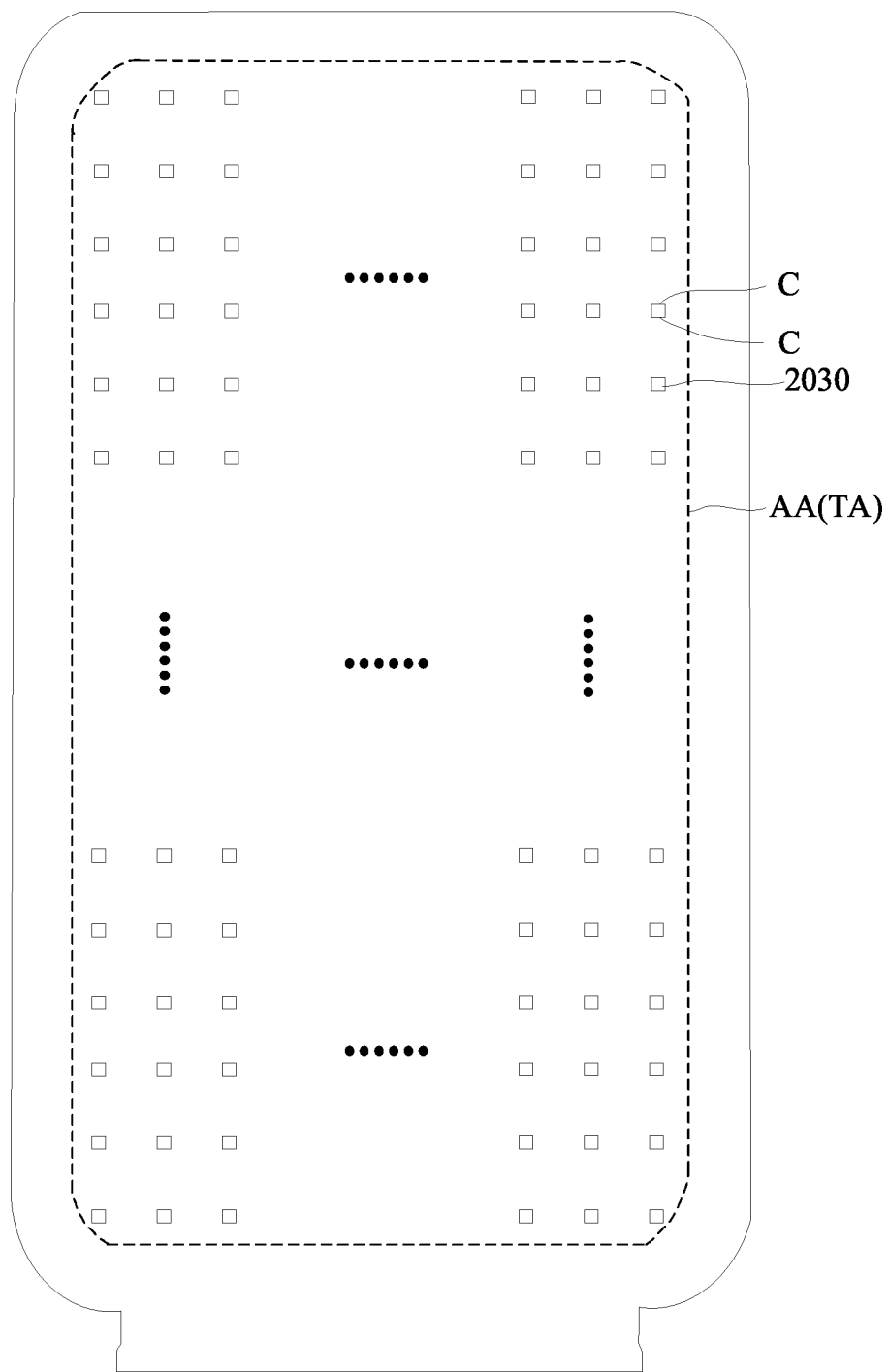
FIG. 25 is a diagram showing a planar arrangement of isolation portions in a display panel, in accordance with some embodiments.

As shown in FIGS. 24 and 25, the second organic layer 203 includes a plurality of isolation portions 2030, each overlapping region B is provided with an isolation portion 2030, and at least the overlapping region B is located in an orthographic projection of the isolation portion 2030 on the display substrate 3; and two ends of an orthographic projection, on the display substrate 3, of a connection portion located in the second conductive layer 204 extend out of a boundary C of an orthographic projection of an isolation portion on the display substrate 3.

In the related art, since the material of the first organic layer includes an organic material, which has a poor high-temperature resistance, and a low-temperature process (e.g., exposure and development processes) is required to form via holes in the first organic layer. However, for the method for forming the via holes, the resolution is small, and there is a phenomenon that the first organic layer cannot be penetrated. Thus, a conductive pattern in the first conductive layer and a conductive pattern in the second conductive layer cannot be electrically connected through via holes in the first organic layer, resulting in an open circuit. In addition, the low-temperature process is used to form holes in the first organic layer, and the critical dimensions (CDs) of different holes have a poor uniformity.

In the display panel 2 in the above embodiments of the present disclosure, the second organic layer 203 is patterned to form the plurality of isolation portions 2030. Each overlapping region B is provided with a single isolation portion 2030, at least the overlapping region B is located in the orthographic projection of the isolation portion 2030 on the display substrate 3, and the first connection portion T12 and the second connection portion T22 are separated by the isolation portion 2030, so that the first connection portion T12 and the second connection portion T22 are insulated in the overlapping region B.

In addition, the two ends of the orthographic projection, on the display substrate 3, of the connection portion located in the second conductive layer 204 extend out of the boundary C of the orthographic projection of the isolation portion on the display substrate 3, so that the two ends of the connection portion are respectively in contact with surfaces of two adjacent touch electrodes to form electrical contact, which ensures a stable electrical connection between the touch electrodes and the connection portion. In addition, it avoids the problem that when the low-temperature process is used to form the via holes in the second organic layer 203, the via holes cannot penetrate through the second organic layer 203, which causes the open circuit between the touch electrodes and the connection portion.

In some embodiments, as shown in FIGS. 23 and 24, the first connection portions T12 are arranged in the first conductive layer 202, the second connection portions T22 are arranged in the second conductive layer 204, two ends of the first connection portion T12 are directly electrically connected to two adjacent first touch electrodes T11, and two ends of the second connection portion T22 are in contact with surfaces of two adjacent second touch electrodes T21 to form electrical contact.

It can be understood that, referring to FIG. 23, each first connection portion T12 and two adjacent first touch electrodes T11 are integrally provided, so as to reduce resistances of positions where the first connection portion T12 and the first touch electrodes T11 are connected.

Referring to FIG. 24, the two ends of the orthographic projection of the second connection portion T22 on the display substrate 3 extend out of the boundary C of the orthographic projection of the isolation portion 2030 on the display substrate 3, and two second touch electrodes T21 adjacent to the second connection portion T22 overlap the surface of the second connection portion T22, so as to ensure the stable electrical connection between the second connection portion T22 and the second touch electrodes T21. In addition, it avoids the problem that when the low-temperature process is used to form the via holes in the second organic layer 203, the via holes cannot penetrate through the second organic layer 203, which causes the open circuit between the second touch electrodes T21 and the second connection portion T22.

In some embodiments, as shown in FIG. 4A, the touch structure 4 further includes a third organic layer 206. The third organic layer 206 is disposed on a side of the second conductive layer 204 away from the first organic layer 201, and plays a role of protecting film layers (such as the second conductive layer 204, the second organic layer 203, the first conductive layer 202 and the first organic layer 201) located under the third organic layer 206.

In some embodiments, a material of the third organic layer 206 may include at least one of polymethyl methacrylate, organosilicon compound, polyimide, or epoxy resin.

Figure 29:
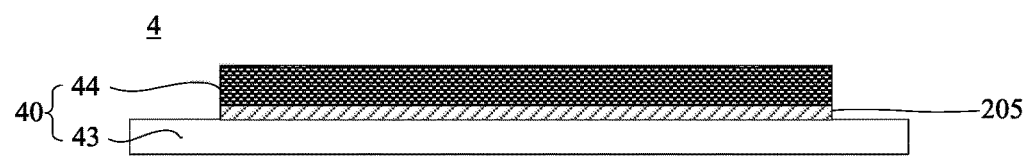
FIGS. 29 to 32 are diagrams showing steps of a manufacturing method of a display panel, in accordance with some embodiments.

Some embodiments of the present disclosure further provide a manufacturing method of a touch structure. As shown in FIG. 29, the touch structure 4 includes at least one touch functional layer group 40, and each touch functional layer group 40 includes an organic layer 43 and a conductive layer 44 that are sequentially stacked.

The manufacturing method includes sequentially forming the organic layer 43 and the conductive layer 44. Before forming the conductive layer 44, the manufacturing method further includes forming a protective pad layer 205 on the organic layer 43. The orthographic projection of the protective pad layer 205 on the organic layer 43 at least partially overlaps with the orthographic projection of the conductive layer 44 on the organic layer 43.

Compared with the related art, in the manufacturing method of the embodiments of the present disclosure, the organic layer 43 is used to replace the inorganic layer; since the resistivity of the organic material is greater than the resistivity of the inorganic material, it may be possible to reduce the interference of the voltage signals transmitted by the electrodes close to the touch structure 4 in the display substrate 3 to the voltage signal transmitted by the conductive layer 44 in the touch structure 4, and in turn improve the touch performance of the touch structure 4.

In addition, the organic layer 43 is an organic material layer, and the bending performance of the organic material layer is better than the bending performance of the inorganic material layer, so that it may be possible to improve the bending performance of the display panel 2 composed of the display substrate 3 and the touch structure 4, and in turn facilitate the preparation of the display panel 2 with the curved screen.

Moreover, during the process of forming the conductive layer 44, the conductive layer 44 is patterned by using a dry etching process. The etching gas used in the dry etching process includes chlorine. Chloride ions are easily adsorbed on the organic layer 43, an acid is generated when the chloride ions meet water, and the acid will corrode the conductive layer 44. Therefore, the protective pad layer 205 is arranged between the conductive layer 44 and the organic layer 43, and the orthographic projection of the protective pad layer 205 on the organic layer 43 at least partially overlaps with the orthographic projection of the conductive layer 44 on the organic layer 43, so that the contact area between the conductive layer 44 and the organic layer 43 may be reduced. As a result, during the process of etching the conductive layer 44, it may ameliorate the corrosion phenomenon of the conductive layer 44 caused by the acid on the organic layer 43.

Figure 30:
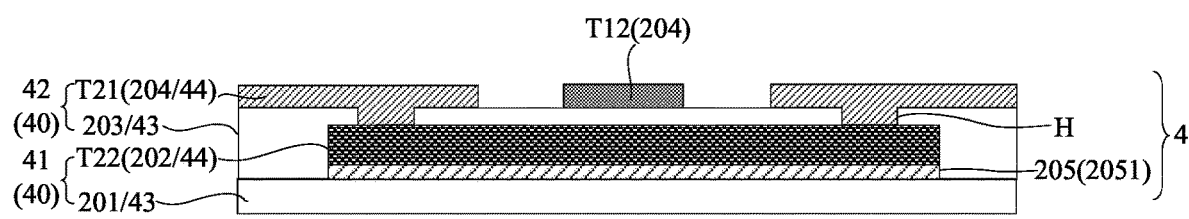

In some embodiments, as shown in FIG. 30, at least one touch functional layer group 40 includes a first touch functional layer group 41 and a second touch functional layer group 42, the first touch functional layer group 41 includes a first organic layer 201 and a first conductive layer 202 that are sequentially stacked, and the second touch functional layer group 42 includes a second organic layer 203 and a second conductive layer 204 that are sequentially stacked.

The manufacturing method includes sequentially forming the first organic layer 201, the first conductive layer 202, the second organic layer 203 and the second conductive layer 204.

Before forming the first conductive layer 202, the manufacturing method further includes forming a first protective pad layer 2051 on the first organic layer 201. An orthographic projection of the first protective pad layer 2051 on the first organic layer 201 at least partially overlaps with an orthographic projection of the first conductive layer 202 on the first organic layer 201.

Compared with the related art, in the manufacturing method of the embodiments of the present disclosure, the first organic layer 201 is used to replace the first inorganic layer, and the second inorganic layer 203 is used to replace the second inorganic layer. Since the resistivity of the organic material is greater than the resistivity of the inorganic material, it may be possible to reduce the interference of the voltage signals transmitted by the electrodes close to the touch structure 4 in the display substrate 3 to the voltage signals transmitted by the first conductive layer 202 and the second conductive layer 204 in the touch structure 4, and in turn improve the touch performance of the touch structure 4.

Moreover, the first organic layer 201 and the second organic layer 203 are both organic material layers, and the bending performance of the organic material layer is better than the bending performance of the inorganic material layer, so that it may be possible to improve the bending performance of the display panel 2 composed of the display substrate 3 and the touch structure 4, and in turn facilitate the preparation of the display panel 2 with the curved screen.

In addition, during the process of forming the first conductive layer 202, the first conductive layer 202 is patterned by using a dry etching process. The etching gas used in the dry etching process includes chlorine. Chloride ions are easily adsorbed on the first organic layer 201, an acid is generated when the chloride ions meet water, and the acid will corrode the conductive layer 44. Therefore, the first protective pad layer 2051 is disposed between the first conductive layer 202 and the first organic layer 201, and the orthographic projection of the first protective pad layer 2051 on the first organic layer 201 at least partially overlaps with the orthographic projection of the first conductive layer 202 on the first organic layer 201, which may reduce the contact area between the first conductive layer 202 and the first organic layer 201, and in turn ameliorate the corrosion phenomenon of the first conductive layer 202 caused by the acid on the first organic layer 201 during the process of etching the first conductive layer 202.

Figure 31:
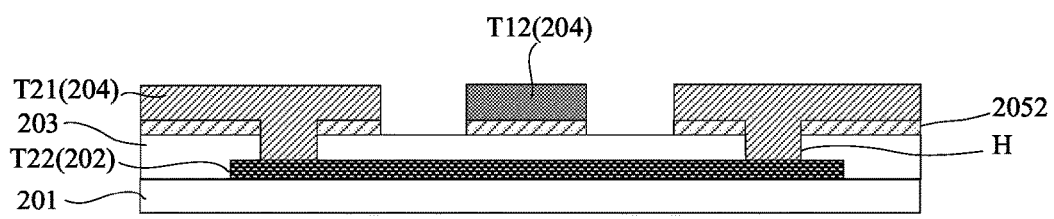

In some embodiments, as shown in FIG. 31, the manufacturing method includes sequentially forming the first organic layer 201, the first conductive layer 202, the second organic layer 203 and the second conductive layer 204.

Before forming the second conductive layer 204, the manufacturing method further includes forming a second protective pad layer 2052 on a side of the second organic layer 203 away from the first organic layer 201. An orthographic projection of the second protective pad layer 2052 on the first organic layer 201 at least partially overlaps with an orthographic projection of the second conductive layer 204 on the first organic layer 201.

Compared with the related art, in the manufacturing method of the embodiments of the present disclosure, the first organic layer 201 is used to replace the first inorganic layer, and the second inorganic layer 203 is used to replace the second inorganic layer. Since the resistivity of the organic material is greater than the resistivity of the inorganic material, it may be possible to reduce the interference of the voltage signals transmitted by the electrodes close to the touch structure 4 in the display substrate 3 to the voltage signals transmitted by the first conductive layer 202 and the second conductive layer 204 in the touch structure 4, and in turn improve the touch performance of the touch structure 4.

Moreover, the first organic layer 201 and the second organic layer 203 are both organic material layers, and the bending performance of the organic material layer is better than the bending performance of the inorganic material layer, so that it may be possible to improve the bending performance of the display panel 2 composed of the display substrate 3 and the touch structure 4, and in turn facilitate the preparation of the display panel 2 with the curved screen.

In addition, during the process of forming the second conductive layer 204, the second conductive layer 204 is patterned by using a dry etching process. The etching gas used in the dry etching process includes chlorine. Chloride ions are easily adsorbed on the second organic layer 203, an acid is generated when the chloride ions meet water, and the acid will corrode the conductive layer 44. Therefore, the second protective pad layer 2052 is arranged between the second conductive layer 204 and the second organic layer 203, and the orthographic projection of the second protective pad layer 2052 on the first organic layer 201 at least partially overlaps with the orthographic projection of the second conductive layer 204 on the first organic layer 201, which may reduce the contact area between the second conductive layer 204 and the second organic layer 203. As a result, during the process of etching the second conductive layer 204, it may ameliorate the corrosion phenomenon of the second conductive layer 204 caused by the acid on the second organic layer 203.

Figure 32:
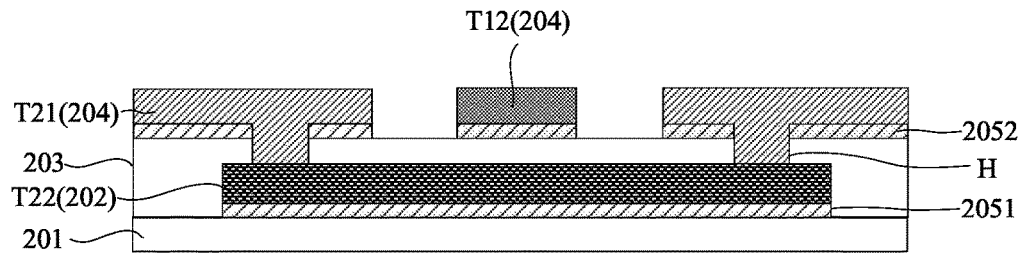

In some embodiments, as shown in FIG. 32, the manufacturing method includes sequentially forming the first organic layer 201, the first conductive layer 202, the second organic layer 203 and the second conductive layer 204.

Before forming the first conductive layer 202, the manufacturing method further includes forming a first protective pad layer 2051 on the first organic layer 201. An orthographic projection of the first protective pad layer 2051 on the first organic layer 201 at least partially overlaps with an orthographic projection of the first conductive layer 202 on the first organic layer 201.

In addition, before forming the second conductive layer 204, the manufacturing method further includes forming a second protective pad layer 2052 on a side of the second organic layer 203 away from the first organic layer 201. An orthographic projection of the second protective pad layer 2052 on the first organic layer 201 at least partially overlaps with an orthographic projection of the second conductive layer 204 on the first organic layer 201.

In some embodiments, forming the first protective pad layer 2051 on the first organic layer 201 includes the following S11 to S13.

Figure 33:
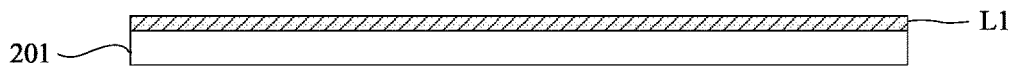
FIGS. 33 to 35 are diagrams showing steps of a method for forming a first protective pad layer, in accordance with some embodiments.

In S11, as shown in FIG. 33, a first protective film L1 is formed on the first organic layer 201.

Figure 34:
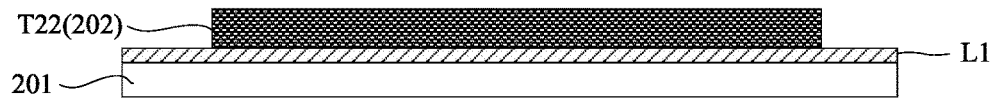

In S12, as shown in FIG. 34, the first conductive layer 202 is formed on a side of the first protective film L1 away from the first organic layer 201.

Figure 35:

In S13, as shown in FIG. 35, the first protection film L1 is patterned to obtain the first protective pad layer 2051 by using the first conductive layer 202 as a mask.

Figure 36:
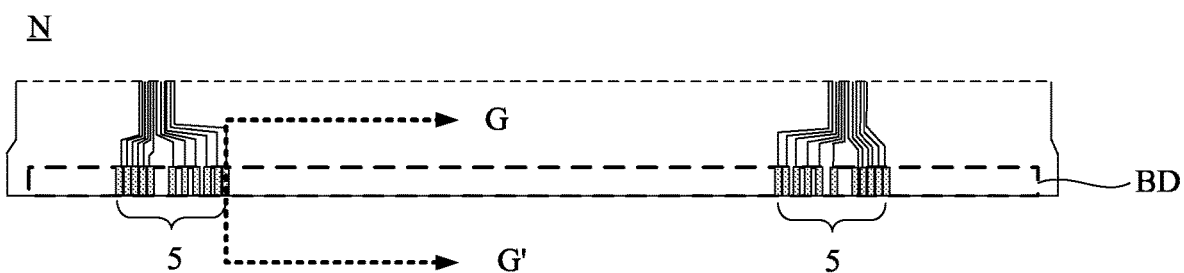
FIG. 36 is a partial enlarged view of the region N in FIG. 2.

In some embodiments, as shown in FIGS. 2 and 36, the touch structure 4 has a touch region TA and a bonding region BD located on a side of the touch region TA, and the display substrate 3 includes a plurality of pins 5 located in the bonding region BD. Forming the first protective pad layer 2051 on the first organic layer 201 includes the following S21 and S22.

Figure 37:
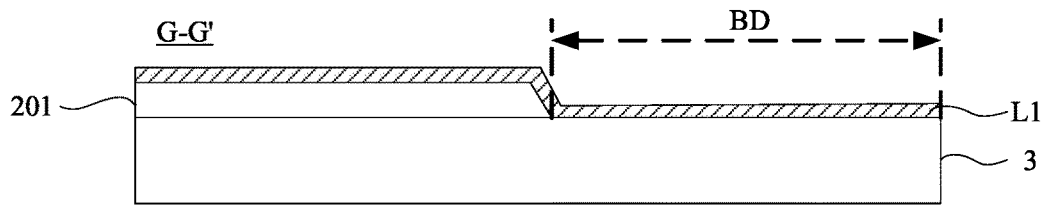
FIGS. 37 and 38 are diagrams showing steps of another method for forming a first protective pad layer, in accordance with some embodiments.

In S21, as shown in FIG. 37, a first protective film L1 is formed on the first organic layer 201.

Figure 38:
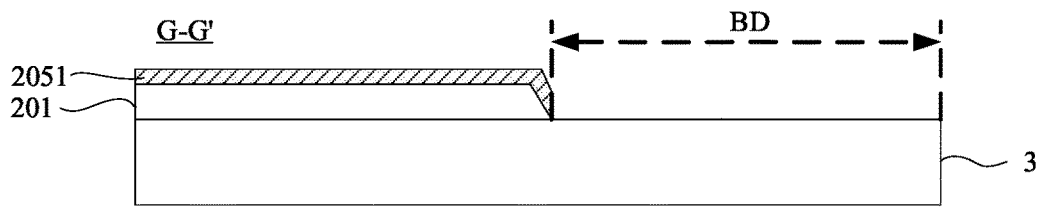

In S22, as shown in FIG. 38, a portion of the first protective film L1 located in the bonding region BD is removed to obtain the first protective pad layer 2051.

For example, a photoresist layer is provided on a surface of the first protective film L1 away from the first organic layer 201, and a portion of the photoresist layer located in the bonding region BD is exposed and developed by using a mask, so that the portion of the photoresist layer located in the bonding region BD is removed. A portion of the first protective film L1 located in the bonding region BD is etched by using the remaining portion of the photoresist layer as a mask, so as to obtain the first protective pad layer 2051.

It should be noted that, in combination with FIG. 36, it can be seen that the touch structures 4 shown in FIGS. 37, 38, and 42 to 45 are each a partial sectional view of the display panel 2 in FIG. 36 along the line G-G'.

In addition, as shown in FIGS. 37 and 38, the first protective film L1 directly cover the plurality of pins 5 of the display substrate 3 located in the bonding region BD, and the portion of the first protective film L1 located in the bonding region BD is removed by using a patterning process, so that the plurality of pins 5 of the display panel 2 located in the bonding region BD are exposed, which facilitates the bonding of the plurality of pins 5 to the flexible printed circuit board.

In some embodiments, forming the second protective pad layer 2052 on the side of the second organic layer 203 away from the first organic layer 201 includes the following S31 to S33.

Figure 39:
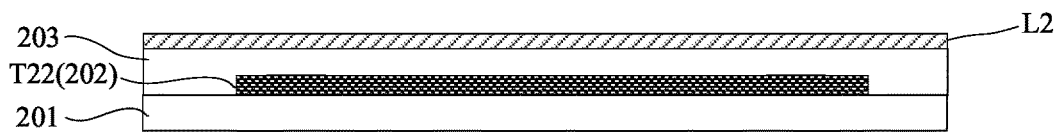
FIGS. 39 to 41 are diagrams showing steps of a method for forming a second protective pad layer, in accordance with some embodiments.

In S31, as shown in FIG. 39, a second protective film L2 is formed on the side of the second organic layer 203 away from the first organic layer 201.

Figure 40:
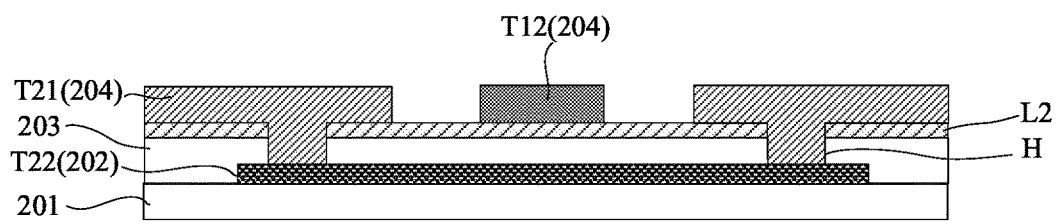

In S32, as shown in FIG. 40, the second conductive layer 204 is formed on a side of the second protective film L2 away from the first organic layer 201.

Figure 41:
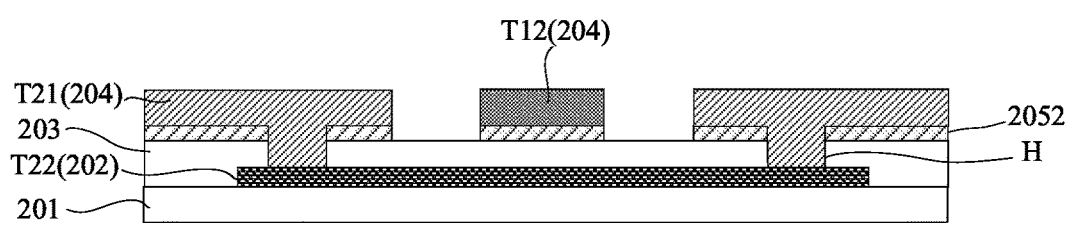

In S13, as shown in FIG. 41, by using the second conductive layer 204 as a mask, the second protective film L2 is patterned to obtain the second protective pad layer 2052.

In some embodiments, forming the second protective pad layer 2052 on the side of the second organic layer 203 away from the first organic layer 201 includes the following S41 and S42.

Figure 42:
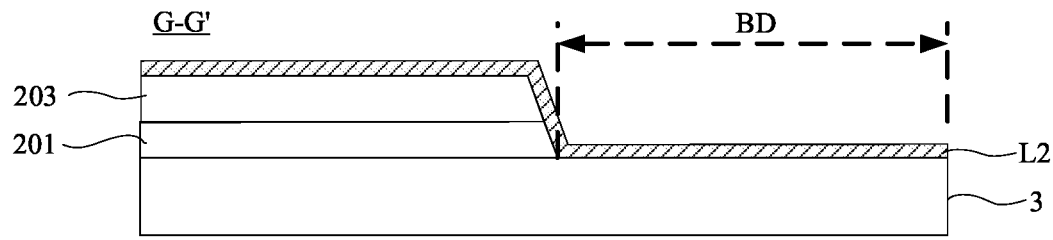
FIGS. 42 and 43 are diagrams showing steps of another method for forming a first protective pad layer, in accordance with some embodiments.

In S41, as shown in FIG. 42, a second protective film L2 is formed on the side of the second organic layer 203 away from the first organic layer 201.

Figure 43:
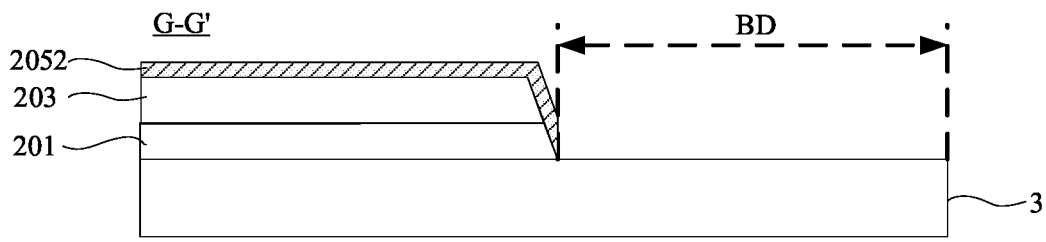

In S42, as shown in FIG. 43, a portion of the second protective film L2 located in the bonding region BD is removed to obtain the second protective pad layer 2052.

For example, a photoresist layer is provided on a surface of the second protective film L2 away from the first organic layer 201, and a portion of the photoresist layer located in the bonding region BD is exposed and developed by using a mask, so that the portion of the photoresist layer located in the bonding region BD is removed. A portion of the second protective film L2 located in the bonding region BD is etched by using the remaining portion of the photoresist layer as a mask, so as to obtain the second protective pad layer 2052.

It should be noted that, as shown in FIGS. 42 and 43, the second protective film L2 directly covers the plurality of pins 5 of the display substrate 3 located in the bonding region BD, and the portion of the second protective film L2 located in the bonding region BD is removed through a patterning process, so that the plurality of pins 5 of the display panel 2 located in the bonding region BD are exposed, which facilitates the bonding of the plurality of pins 5 to the flexible printed circuit board.

Figure 44:
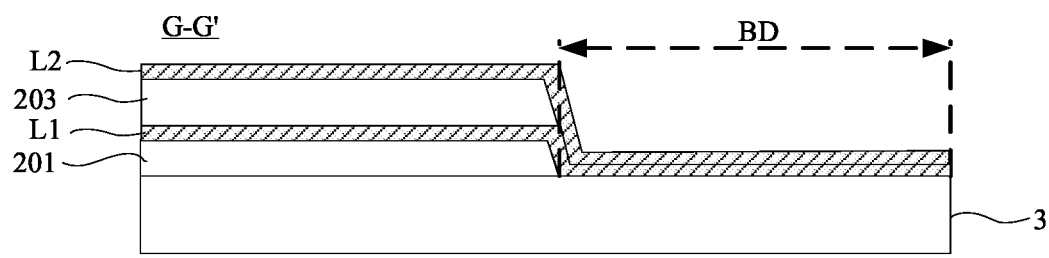
FIGS. 44 and 45 are diagrams showing steps of forming a first protective pad layer and a second protective pad layer by using a same patterning process, in accordance with some embodiments.

In some other embodiments, as shown in FIG. 44, the first protective film L1, the second organic layer 203 and the second protective film L2 are sequentially formed on the first organic layer 201.

Figure 45:
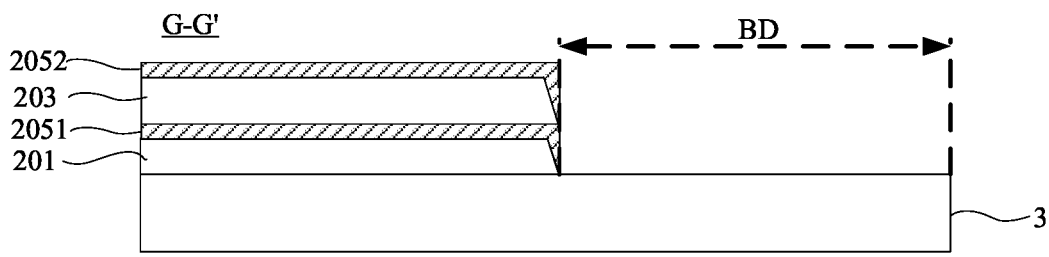

As shown in FIG. 45, the portion of the first protection film L1 located in the bonding region BD and the portion of the second protection film L2 located in the bonding region BD are removed by using the same patterning process, so as to obtain the first protective pad layer 2051 and the second protective pad layer 2052.

For example, a photoresist layer is provided on a surface of the second protective film L2 away from the first organic layer 201, and a portion of the photoresist layer located in the bonding region BD is exposed and developed by using a mask, so that the portion of the photoresist layer located in the bonding region BD is removed. A portion of the first protective film L1 located in the bonding region BD and a portion of the second protective film L2 located in the bonding region BD are etched by using the remaining portion of the photoresist layer as a mask, so as to obtain the first protective pad layer 2051 and the second protective pad layer 2052.

It should be noted that, as shown in FIGS. 44 and 45, the first protective film L1 and the second protective film L2 directly cover the plurality of pins 5 of the display substrate 3 located in the bonding region BD. The portion of the first protective film L1 located in the bonding region BD and the portion of the second protective film L2 located in the bonding region BD are removed by the same patterning process, so that the plurality of pins 5 of the display panel 2 located in the bonding region BD are exposed, which facilitates the bonding of the plurality of pins 5 to the flexible printed circuit board.

The foregoing descriptions are merely specific implementation manners of the present disclosure, but the protection scope of the present disclosure is not limited thereto, any changes or replacements that a person skilled in the art could conceive of within the technical scope of the present disclosure shall be included in the protection scope of the present disclosure. Therefore, the protection scope of the present disclosure should be determined by the protection scope of the claims.

What is claimed is:

1. A touch structure, comprising:
   at least one touch functional layer group, the at least one touch functional layer group including an organic layer and a conductive layer that are sequentially stacked, wherein the at least one touch functional layer group includes:
   a first touch functional layer group including a first organic layer and a first conductive layer that are sequentially stacked; and
   a second touch functional layer group disposed on a side of the first conductive layer away from the first organic layer, the second touch functional layer group including a second organic layer and a second conductive layer that are sequentially stacked; and
   at least one protective pad layer arranged in one-to-one correspondence with the at least one touch functional layer group, wherein a protective pad layer of the at least one protective pad layer is located between a conductive layer and an organic layer of a corresponding touch functional layer group, and an orthographic projection of the protective pad layer on the organic layer of the corresponding touch functional layer group at least partially overlaps with an orthographic projection of the conductive layer of the corresponding touch functional layer group on the organic layer of the corresponding touch functional layer group;

wherein a material of the protective pad layer includes an inorganic material;

wherein the at least one protective pad layer is arranged corresponding to the first conductive layer and/or the second conductive layer, and an orthographic projection of the protective pad layer on the first organic layer at least partially overlaps an orthographic projection of a corresponding conductive layer on the first organic layer;

wherein the orthographic projection of the protective pad layer on the first organic layer approximately coincides with the orthographic projection of the corresponding conductive layer on the first organic layer; or the orthographic projection of the protective pad layer on the first organic layer is a closed shape, and the orthographic projection of the corresponding conductive layer on the first organic layer is located within a boundary of the closed shape;

wherein the touch structure has a touch region and a bonding region located on a side of the touch region; and the orthographic projection of the protective pad layer on the first organic layer and the bonding region are staggered.

2. The touch structure according to claim 1, wherein a thickness of a conductive layer in the first conductive layer and the second conductive layer that is arranged corresponding to the protective pad layer is greater than or equal to 0.3 µm.

3. The touch structure according to claim 2, wherein one of the first conductive layer and the second conductive layer is arranged corresponding to the protective pad layer, and the thickness of the conductive layer that is arranged corresponding to the protective pad layer is greater than a thickness of another of the first conductive layer and the second conductive layer.

4. The touch structure according to claim 3, wherein a thickness of one of the first conductive layer and the second conductive layer that is arranged corresponding to no protective pad layer is less than 0.3 µm.

5. The touch structure according to claim 1, further comprising:

a plurality of touch units disposed in the touch region and including a plurality of first touch units and a plurality of second touch units, wherein each first touch unit extends along a first direction, and the plurality of first touch units are arranged side by side along a second direction, the second direction and the first direction intersecting; each second touch unit extends along the second direction, and the plurality of second touch units are arranged side by side along the first direction;

the first touch unit includes a plurality of first touch electrodes and a plurality of first connection portions, and two adjacent first touch electrodes are electrically connected to each other through a first connection portion;

the second touch unit includes a plurality of second touch electrodes and a plurality of second connection portions, and two adjacent second touch electrodes are electrically connected to each other through a second connection portion;

wherein the plurality of first touch electrodes, the plurality of second touch electrodes and the plurality of first connection portions are arranged in one of the first conductive layer and the second conductive layer, and the plurality of second connection portions are arranged in another of the first conductive layer and the second conductive layer; or the plurality of first touch electrodes, the plurality of second touch electrodes and the plurality of second connection portions are arranged in the one of the first conductive layer and the second conductive layer, and the plurality of first connection portions are arranged in the another of the first conductive layer and the second conductive layer.

6. The touch structure according to claim 5, wherein the plurality of first touch electrodes, the plurality of second touch electrodes and the plurality of first connection portions are arranged in the same conductive layer, and a conductive layer where the plurality of second connection portions are located is arranged corresponding to the protective pad layer; or the plurality of first touch electrodes, the plurality of second touch electrodes and the plurality of second connection portions are arranged in the same conductive layer, and a conductive layer where the plurality of first connection portions are located is arranged corresponding to the protective pad layer.

7. The touch structure according to claim 5, further comprising:

a plurality of auxiliary electrodes, wherein the plurality of first touch electrodes and the plurality of second touch electrodes are arranged in one of the first conductive layer and the second conductive layer, and the plurality of auxiliary electrodes are arranged in another of the first conductive layer and the second conductive layer;

an orthographic projection of each auxiliary electrode on the first organic layer at least partially overlaps an orthographic projection of a first touch electrode of the plurality of first touch electrodes or a second touch electrode of the plurality of second touch electrodes on the first organic layer; and the auxiliary electrode is electrically connected to the first touch electrode or the second touch electrode through via boles in the second organic layer.

8. A display panel, comprising:

a display substrate; and the touch structure according to claim 1, the touch structure being disposed on a light-exit side of the display substrate.

9. The display panel according to claim 8, wherein the display substrate includes an encapsulation layer, and the touch structure is directly disposed on the encapsulation layer.

10. A display device, comprising the display panel according to claim 8.

11. The touch structure according to claim 1, wherein the at least one protective pad layer includes a first protective pad layer and/or a second protective pad layer;

the first protective pad layer is arranged corresponding to the first conductive layer, and is located between the first conductive layer and the first organic layer; and the second protective pad layer is arranged corresponding to the second conductive layer, and is located between the second conductive layer and the second organic layer.

12. The touch structure according to claim 1, wherein a surface of the protective pad layer close to a corresponding conductive layer has a plurality of depressions, and a surface of the corresponding conductive layer away from the protective pad layer has a plurality of depressions.

13. The touch structure according to claim 1, wherein
a thickness of the protective pad layer is less than a thickness of the organic layer of the corresponding touch functional layer group.

14. A manufacturing method of a touch structure, the touch structure including at least one touch functional layer group, each touch functional layer group including an organic layer and a conductive layer that are sequentially stacked;
the manufacturing method comprising:
sequentially forming the organic layer and the conductive layer;
wherein before forming the conductive layer, the manufacturing method further comprises forming a protective pad layer on the organic layer, an orthographic projection of the protective pad layer on the organic layer at least partially overlapping with an orthographic projection of the conductive layer on the organic layer, and a material of the protective pad layer includes an inorganic material;
wherein the at least one touch functional layer group includes a first touch functional layer group and a second touch functional layer group, the first touch functional layer group includes a first organic layer and a first conductive layer that are sequentially stacked, and the second touch functional layer group includes a second organic layer and a second conductive layer that are sequentially stacked; and
the manufacturing method comprises:
sequentially forming the first organic layer, the first conductive layer, the second organic layer, and the second conductive layer;
wherein before forming the first conductive layer, the manufacturing method further comprises: forming a first protective pad layer on the first organic layer, an orthographic projection of the first protective pad layer on the first organic layer at least partially overlapping with an orthographic projection of the first conductive layer on the first organic layer; and/or
before forming the second conductive layer, the manufacturing method further comprises: forming a protective pad layer on a side of the second organic layer away from the first organic layer, an orthographic projection of the second protective pad layer on the first organic layer at least partially overlapping with an orthographic projection of the second conductive layer on the first organic layer;
wherein forming the first protective pad layer on the first organic layer includes:
forming a first protective film on the first organic layer;
forming the first conductive layer on a side of the first protective film away from the first organic layer; and
patterning the first protective film by using the first conductive layer as a mask, so as to obtain the first protective pad layer; or
the touch structure has a touch region and a bonding region located on a side of the touch region, and forming the first protective pad layer on the first organic layer includes:
forming the first protective film on the first organic layer; and
removing a portion of the first protective film located in the bonding region, so as to obtain the first protective pad layer.

15. A manufacturing method of a touch structure, the touch structure including at least one touch functional layer group, each touch functional layer group including an organic layer and a conductive layer that are sequentially stacked;
the manufacturing method comprising:
sequentially forming the organic layer and the conductive layer;
wherein before forming the conductive layer, the manufacturing method further comprises forming a protective pad layer on the organic layer, an orthographic projection of the protective pad layer on the organic layer at least partially overlapping with an orthographic projection of the conductive layer on the organic layer and a material of the protective pad layer includes an inorganic material;
wherein the at least one touch functional layer group includes a first touch functional layer group and a second touch functional layer group, the first touch functional layer group includes a first organic layer and a first conductive layer that are sequentially stacked, and the second touch functional layer group includes a second organic layer and a second conductive layer that are sequentially stacked; and
the manufacturing method comprises:
sequentially forming the first organic layer, the first conductive layer, the second organic layer, and the second conductive layer;
wherein before forming the first conductive layer, the manufacturing method further comprises: forming a first protective pad layer on the first organic layer an orthographic projection of the first protective pad layer on the first organic layer at least partially overlapping with an orthographic projection of the first conductive layer on the first organic layer; and/or
before forming the second conductive layer, the manufacturing method further comprises: forming a second protective pad layer on a side of the second organic layer away from the first organic layer, an orthographic projection of the second protective pad layer on the first organic layer at least partially overlapping with an orthographic projection of the second conductive layer on the first organic layer;
wherein forming the second protective pad layer on the side of the second organic layer away from the first organic layer includes:
forming a second protective film on the side of the second organic layer away from the first organic layer;
forming the second conductive layer on a side of the second protective film away from the first organic layer; and
patterning the second protective film by using the second conductive layer as a mask, so as to obtain the second protective pad layer; or
the touch structure has a touch region and a bonding region located on a side of the touch region, and forming the second protective pad layer on the side of the second organic layer away from the first organic layer includes:
forming the second protective film on the side of the second organic layer away from the first organic layer; and
removing a portion of the second protective film located in the bonding region, so as to obtain the second protective pad layer.

* * * * *